US012772560B2

(12) United States Patent
Kim et al.

(10) Patent No.: US 12,772,560 B2
(45) Date of Patent: Oct. 20, 2026

(54) INTEGRATED CIRCUIT DEVICE

(71) Applicant: Samsung Electronics Co., Ltd., Suwon-si (KR)

(72) Inventors: Jinman Kim, Suwon-si (KR); Young Ha Kim, Suwon-si (KR); Yigwon Kim, Suwon-si (KR); Hyunjae Kang, Suwon-si (KR); Jonggu Lee, Suwon-si (KR); Ingu Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 291 days.

(21) Appl. No.: 18/760,724

(22) Filed: Jul. 1, 2024

(65) Prior Publication Data

US 2025/0227995 A1 Jul. 10, 2025

(30) Foreign Application Priority Data

Jan. 4, 2024 (KR) ........................ 10-2024-0001553

(51) Int. Cl.
*H10D 84/90* (2025.01)

(52) U.S. Cl.
CPC ......... *H10D 84/907* (2025.01); *H10D 84/953* (2025.01); *H10D 84/981* (2025.01)

(58) Field of Classification Search
CPC .. H10D 84/907; H10D 84/953; H10D 84/981; H10D 30/0198; H10D 64/254; H10D 30/797; H10D 62/822; H10D 64/2565; H10D 84/832; H10D 30/6735; H10D 62/121; H10D 84/853;
(Continued)

(56) References Cited

U.S. PATENT DOCUMENTS 8,383,460 B1 2/2013 Yim
9,496,163 B2 11/2016 Jeon et al.
(Continued)

FOREIGN PATENT DOCUMENTS

JP 2009-090416 A 4/2009
KR 10-1152822 B1 5/2012
(Continued)

OTHER PUBLICATIONS

Extended European Search Report in European Appln. No. 24216048.9, mailed on May 30, 2025, 21 pages.

*Primary Examiner* — Wasiul Haider
(74) *Attorney, Agent, or Firm* — Fish & Richardson P.C.

(57) ABSTRACT

An integrated circuit device includes a first semiconductor substrate having a frontside surface and a backside surface opposite to each other, an FEOL structure on the frontside surface of the first semiconductor substrate, a first BEOL structure on the FEOL structure, a second BEOL structure on the backside surface of the first semiconductor substrate, and a second semiconductor substrate apart from the first semiconductor substrate in a vertical direction with the FEOL structure and the first BEOL structure The second semiconductor substrate is locally bonded to the first BEOL structure. The second semiconductor substrate includes a main surface facing the first BEOL structure, and the main surface of the second semiconductor substrate defines a local trench region in which trenches are defined in a regular pattern and local bonding areas bonded to the first BEOL structure.

20 Claims, 34 Drawing Sheets

(58) Field of Classification Search

CPC ..... H10D 30/6211; H10D 30/62–6219; H10D 30/024–0245; H10D 84/0158; H10D 84/0193; H10D 86/011; H10D 84/834; H10D 86/215; H10D 30/501–509; H10W 70/093; H10W 20/20; H10W 20/427; H10W 20/481; H10W 20/083; H10W 20/435; H10W 20/42; H10W 80/301; H10W 80/312; H10W 80/314; H10B 12/36; H10B 12/056

See application file for complete search history.

(56) References Cited

U.S. PATENT DOCUMENTS

| | | | |
|---|---|---|---|
| 9,647,017 B2 | 5/2017 | Kim | |
| 2010/0289144 A1 | 11/2010 | Farooq et al. | |
| 2017/0133345 A1 | 5/2017 | Knickerbocker et al. | |
| 2021/0343654 A1* | 11/2021 | Huang | H10W 20/056 |
| 2022/0352119 A1 | 11/2022 | Chang | |
| 2023/0253293 A1 | 8/2023 | Cho et al. | |
| 2023/0275063 A1 | 8/2023 | Hong et al. | |
| 2024/0153875 A1* | 5/2024 | Xie | H10D 30/014 |

FOREIGN PATENT DOCUMENTS

| | | | |
|---|---|---|---|
| KR | 10-2015-0066006 | A | 6/2015 |
| KR | 10-2328140 | B1 | 11/2021 |
| KR | 10-2023-0128962 | A | 9/2023 |
| WO | WO 2022/201530 | A1 | 9/2022 |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2024-0001553, filed on Jan. 4, 2024, in the Korean Intellectual Property Office, the disclosure of which is incorporated by reference herein in its entirety.

BACKGROUND

Inventive concepts relate to an integrated circuit (IC) device and/or a method of manufacturing the same, and more particularly, to an IC device including a back-side power delivery network (BSPDN) structure including a wiring structure formed at a backside of a substrate, and/or a method of manufacturing the IC device.

The downscaling of IC devices has rapidly progressed with the development of electronics technology. Accordingly, research has been conducted on more efficiently designing wiring structures to achieve high integration while ensuring or helping to ensure the functions and operation speed required for an IC device. Alternatively or additionally, in an IC device manufactured using a semiconductor substrate, as the semiconductor substrate gradually becomes thinner and sizes of patterns to be formed on the semiconductor substrate are reduced, it becomes more necessary to develop an IC device with a new structure in which patterns formed at different vertical levels have good or excellent overlay precision, and/or a method of manufacturing the IC device.

SUMMARY

Various example embodiments may provide an integrated circuit (IC) device with a structure capable of improving overlay precision by minimizing or reducing bending distortion of a semiconductor device and overlay errors in patterns formed at different vertical levels on the semiconductor substrate, even when the semiconductor substrate gradually becomes thinner and/or sizes of patterns to be formed on the semiconductor substrate are reduced.

Alternatively or additionally, various example embodiments may provide a method of manufacturing an IC device, which improves overlay precision by reducing or minimizing process failures caused by bending distortion of a semiconductor device and/or overlay errors in patterns formed at different vertical levels on the semiconductor substrate even when the semiconductor substrate gradually becomes thinner and/or sizes of patterns to be formed on the semiconductor substrate are reduced. Thus, the method may improve the critical dimension (CD) uniformity of patterns required for the manufacture of the IC device, and enable the manufacture of reliable IC devices.

According to various example embodiments, there is provided an IC device including a first semiconductor substrate having a frontside surface and a backside surface opposite to each other, a front-end-of-line (FEOL) structure on the frontside surface of the first semiconductor substrate, the FEOL structure including a plurality of fin-type active areas, a first back-end-of-line (BEOL) structure on the FEOL structure, the first BEOL structure apart from the first semiconductor substrate in a vertical direction with the FEOL structure therebetween, a second BEOL structure on the backside surface of the first semiconductor substrate, the second BEOL structure being apart from the FEOL structure in the vertical direction with the first semiconductor substrate therebetween, and a second semiconductor substrate apart from the first semiconductor substrate in the vertical direction with the FEOL structure and the first BEOL structure therebetween. The second semiconductor substrate is locally bonded to the first BEOL structure. The second semiconductor substrate includes a main surface facing the first BEOL structure. The main surface of the second semiconductor substrate defines a local trench region in which a plurality of trenches are arranged in a regular pattern and a plurality of local bonding areas bonded to the first BEOL structure.

Alternatively or additionally according to various example embodiments, there is provided an IC device including a first semiconductor substrate having a frontside surface and a backside surface, which are opposite to each other, a front-end-of-line (FEOL) structure on the frontside surface of the first semiconductor substrate, the FEOL structure including a plurality of fin-type active areas, a first back-end-of-line (BEOL) structure on the FEOL structure, the first BEOL structure being apart from the first semiconductor substrate in a vertical direction with the FEOL structure therebetween, a second BEOL structure on the backside surface of the first semiconductor substrate, the second BEOL structure apart from the FEOL structure in the vertical direction with the first semiconductor substrate therebetween, and a second semiconductor substrate apart from the first semiconductor substrate in the vertical direction with the FEOL structure and the first BEOL structure therebetween, the second semiconductor substrate having a main surface locally bonded to the first BEOL structure. The main surface of the second semiconductor substrate defines a plurality of air gaps together with the first BEOL structure and defines a plurality of local trench regions in which a plurality of trenches are arranged in a regular pattern and a plurality of local bonding areas are bonded to the first BEOL structure.

Alternatively or additionally according to various example embodiments, there is provided an integrated circuit (IC) device including a first semiconductor substrate having a frontside surface and a backside surface that are opposite to each other, a front-end-of-line (FEOL) structure including a fin-type active area integrally connected to the first semiconductor substrate, a gate line located on the fin-type active area, and at least one nanosheet between the fin-type active area and the gate line, the at least one nanosheet surrounded by the gate line, a first back-end-of-line (BEOL) structure on the FEOL structure, the first BEOL structure apart from the first semiconductor substrate in a vertical direction with the FEOL structure therebetween, and the first BEOL structure including a frontside wiring structure, a second BEOL structure on the backside surface of the first semiconductor substrate, the second BEOL structure apart from the FEOL structure in the vertical direction with the first semiconductor substrate therebetween, the second BEOL structure including a backside wiring structure, and a second semiconductor substrate apart from the first semiconductor substrate in the vertical direction with the FEOL structure and the first BEOL structure therebetween. The second semiconductor substrate faces a main surface facing the first BEOL structure, the main surface defines a first local trench region and a second local trench region, which extend lengthwise in directions intersecting each other, and a plurality of local bonding areas bonded to the first BEOL structure. A plurality of trenches are arranged in a regular pattern in each of the first local trench region and the second local trench region, and an area occupied by the plurality of trenches in a unit area of the main surface is 20% or less.

Alternatively or additionally according to various example embodiments, there is provided a method of manufacturing an IC device. The method includes forming a front-end-of-line (FEOL) structure on a frontside surface of a first semiconductor substrate having the frontside surface and a backside surface opposite to the frontside surface; forming a first back-end-of-line (BEOL) structure on the FEOL structure; forming a second semiconductor substrate having a main surface in which a plurality of trenches are arranged in a regular pattern is provided; bonding surfaces excluding the plurality of trenches of the main surface of the second semiconductor substrate to the first BEOL structure at a position where the main surface of the second semiconductor substrate faces the first BEOL structure in a vertical direction, and thus, the first BEOL structure is bonded to the second semiconductor substrate, at least partly while the first BEOL structure is being bonded to the second semiconductor substrate polishing the first semiconductor substrate from a backside surface of the first semiconductor substrate to reduce a thickness of the first semiconductor substrate, and at least partly while the first BEOL structure is being bonded to the second semiconductor substrate, forming a second BEOL structure on the polished backside surface of the first semiconductor substrate.

BRIEF DESCRIPTION OF THE DRAWINGS

Embodiments will be more clearly understood from the following detailed description taken in conjunction with the accompanying drawings in which:

FIGS. 4A to 4C are detailed diagrams of the second wafer shown in FIG. 3B, wherein FIG. 4A is an enlarged plan view of region "EX3" of FIG. 3B, FIG. 4B is a cross-sectional view taken along line DX-DX' of FIG. 4A, and FIG. 4C is a cross-sectional view taken along line DY-DY' of FIG. 4A;

FIGS. 13A, 13B, 13C, and 13D are diagrams for explaining an overlay key that may be used to measure overlay between patterns included in a front-end-of-line (FEOL) structure and patterns included in a second BEOL structure in a method of manufacturing an IC device, according to various example embodiments, wherein FIG. 13A is a plan view of a partial region of the FEOL structure according to an embodiment, FIG. 13B is a plan view of a partial region of the second BEOL structure according to an embodiment, FIG. 13C is a plan view of an overlay key obtained from the resultant structure in which at least a portion of the second BEOL structure is formed, and FIG. 13D is a cross-sectional view taken along lines X1-X1' and X2-X2' of FIG. 13C.

DETAILED DESCRIPTION OF VARIOUS EXAMPLE EMBODIMENTS

Figure 1:
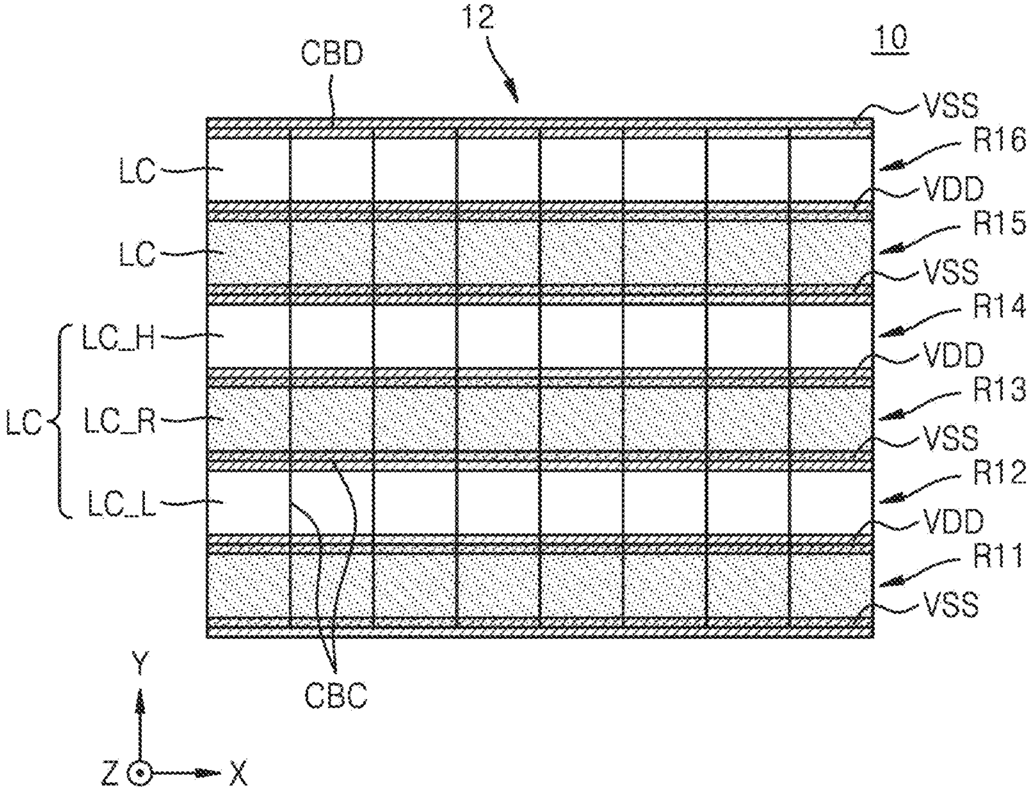
FIG. 1 is a plan view of a cell block of an integrated circuit (IC) device according to various example embodiments.

Hereinafter, various example embodiments will be described in detail with reference to the accompanying drawings. The same reference numerals are used to denote the same elements in the drawings, and repeated descriptions thereof are omitted.

FIG. 1 is a plan view of a cell block 12 of an integrated circuit (IC) device 10 according to various example embodiments.

Referring to FIG. 1, the cell block 12 of the IC device 10 may include a plurality of cells LC each including circuit patterns configured to constitute or to be included in various circuits. The plurality of cells LC may be arranged in a matrix form in a widthwise direction (or an X direction in FIG. 1) and a height direction (or a Y direction in FIG. 1) in the cell block 12.

Each of the plurality of cells LC may constitute a logic cell. Each of the plurality of cells LC may include a circuit pattern having a layout designed according to a place-and-route (PnR) technique to perform at least one logic function. The plurality of cells LC may perform various logic functions. In some example embodiments, the plurality of cells LC may include a plurality of standard cells. In some example embodiments, at least some of the plurality of cells LC may perform the same logic function. In some example embodiments, at least some of the plurality of cells LC may perform different logic functions.

The plurality of cells LC may include various kinds of logic cells including a plurality of circuit elements. For example, each of the plurality of cells LC may include or be included in one or more of an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, a latch, or a combination thereof, without being limited thereto.

In the cell block 12, at least some of the plurality of cells LC that forms one row R11, R12, R13, R14, R15, or R16 in the widthwise direction (or the X direction in FIG. 1) may have the same width as each other. Alternatively or additionally, at least some of the plurality of cells LC that forms one row R11, R12, R13, R14, R15, or R16 may have the same height as each other. However, example embodiments are not limited to those illustrated in FIG. 1, and at least some of the plurality of cells LC that forms one row R11, R12, R13, R14, R15, or R16 may have different widths and/or heights from each other.

An area of each of the plurality of cells LC included in the cell block 12 of the IC device 10 may be defined by a cell boundary CBD. A cell boundary contact portion CBC where respective cell boundaries CBD of two cells LC that are adjacent to each other in the widthwise direction (or the X direction in FIG. 1) or the height direction (or the Y direction in FIG. 1), from among the plurality of cells LC, meet each other may be between the two adjacent cells LC.

In various example embodiments, from among the plurality of cells LC that form one row R11, R12, R13, R14, R15, or R16, two cells LC that are adjacent to each other in the widthwise direction may contact each other at the cell boundary contact portion CBC without a distance therebetween. In some example embodiments, from among the plurality of cells LC that form one row R11, R12, R13, R14, R15, or R16, two cells LC that are adjacent to each other in the widthwise direction may be a predetermined distance apart from each other.

In various example embodiments, from among the plurality of cells LC that form one row R11, R12, R13, R14, R15, or R16, two adjacent cells LC may perform the same function as each other. In this case, the two adjacent cells LC may have the same structure as each other. In some example embodiments, from among the plurality of cells LC that form one row R11, R12, R13, R14, R15, or R16, two adjacent cells may perform different functions from each other.

In various example embodiments, one cell LC, which is selected from the plurality of cells LC included in the cell block 12 of the IC device 10, may have a symmetrical structure to another cell LC, which is adjacent to the selected cell LC in the height direction (or the Y direction in FIG. 1), about the cell boundary contact portion CBC located therebetween. For example, a reference logic cell LC_R in a third row R3 may have a symmetrical structure to a lower logic cell LC_L in a second row R2 about the cell boundary contact portion CBC located therebetween. Also, the reference logic cell LC_R in the third row R3 may have a symmetrical structure to an upper logic cell LC_H in a fourth row R4 about the cell boundary contact portion CBC located therebetween.

Although FIG. 1 illustrates an example in which the cell block 12 including six rows R11, R12, R13, R14, R15, and R16, example embodiments are not limited thereto. The cell block 12 may include various numbers of rows, which are selected as needed or as desired, and one row may include various numbers of logic cells, which are selected as needed or as desired.

A selected one of a plurality of ground lines VSS and a plurality of power lines VDD may be between a plurality of rows (e.g., R11, R12, R13, R14, R15, and R16), each of which includes a plurality of cells LC arranged in a line in the widthwise direction (or the X direction in FIG. 1). The plurality of ground lines VSS and the plurality of power lines VDD may each extend in a first lateral direction (X direction) and may be alternately arranged apart from each other in a second lateral direction (Y direction). Accordingly, the plurality of ground lines VSS and the plurality of power lines VDD may each overlap the cell boundary CBD of the cell LC in the second lateral direction (Y direction).

Figure 2:
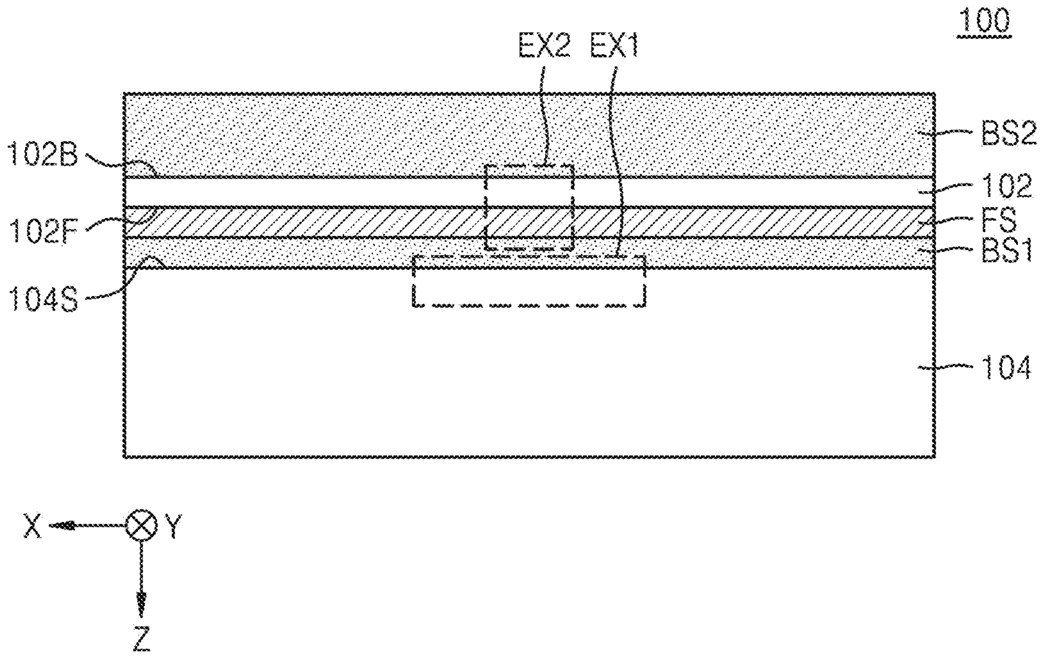
FIG. 2 is a cross-sectional view of an IC device according to various example embodiments.

FIG. 2 is a cross-sectional view of an IC device 100 according to various example embodiments. Components of the IC device 100 described with reference to FIG. 2 may constitute or be included in portions of the plurality of cells LC shown in FIG. 1.

Referring to FIG. 2, the IC device 100 may include a first semiconductor substrate 102 and a second semiconductor substrate 104, which overlap each other in a vertical direction (Z direction). The first semiconductor substrate 102 may have a frontside surface 102F and a backside surface 102B, which are opposite to each other. The second semiconductor substrate 104 may have a main surface 104S facing the frontside surface 102F of the first semiconductor substrate 102. Each of the first semiconductor substrate 102 and the second semiconductor substrate 104 may include a silicon substrate; however, example embodiments are not limited thereto, and either or both of the first semiconductor substrate 102 and the second semiconductor substrate 104 may be or may include other materials such as III-V materials.

A front-end-of-line (FEOL) structure FS may be on the frontside surface 102F of the first semiconductor substrate 102. The FEOL structure FS may include a plurality of fin-type active areas (e.g., fin-type active areas F1 shown in FIGS. 8A to 8D), which are integrally connected to the first semiconductor substrate 102. The FEOL structure FS may include components required to or used to constitute or be included in a logic cell. For example, the FEOL structure FS may include a plurality of active areas, a plurality of source/drain regions, a plurality of gate lines, and a plurality of wiring structures configured to selectively connect the plurality of active areas, the plurality of source/drain regions, and the plurality of gate lines to each other and/or to the outside.

A first back-end-of-line (BEOL) structure BS1 may be on the FEOL structure FS. The first BEOL structure BS1 may be apart from the first semiconductor substrate 102 with the FEOL structure FS therebetween in the vertical direction (Z direction).

A second BEOL structure BS2 may be on the backside surface 102B of the first semiconductor substrate 102. The second BEOL structure BS2 may be apart from the FEOL structure FS with the first semiconductor substrate 102 therebetween in the vertical direction (Z direction). The second semiconductor substrate 104 may be apart from the first semiconductor substrate 102 with the FEOL structure FS and the first BEOL structure BS1 therebetween in the vertical direction (Z direction).

In various example embodiments, the IC device 100 shown in FIG. 2 may constitute (or be included in) a portion of one or more of a logic chip, such as an analog-to-digital converter (ADC) and/or an application-specific IC (ASIC); a memory chip, such as a volatile memory (e.g., dynamic random access memory (DRAM)), a non-volatile memory (e.g., read-only memory (ROM)), and flash memory; an application processor chip, such as a central processor (e.g., a central processing unit (CPU)), a graphics processor (e.g., a graphics processing unit (GPU)), a digital signal processor, a cryptographic processor, a microprocessor, and a micro-controller; and/or a power management chip, such as a power management IC (PMIC).

Figure 3A:
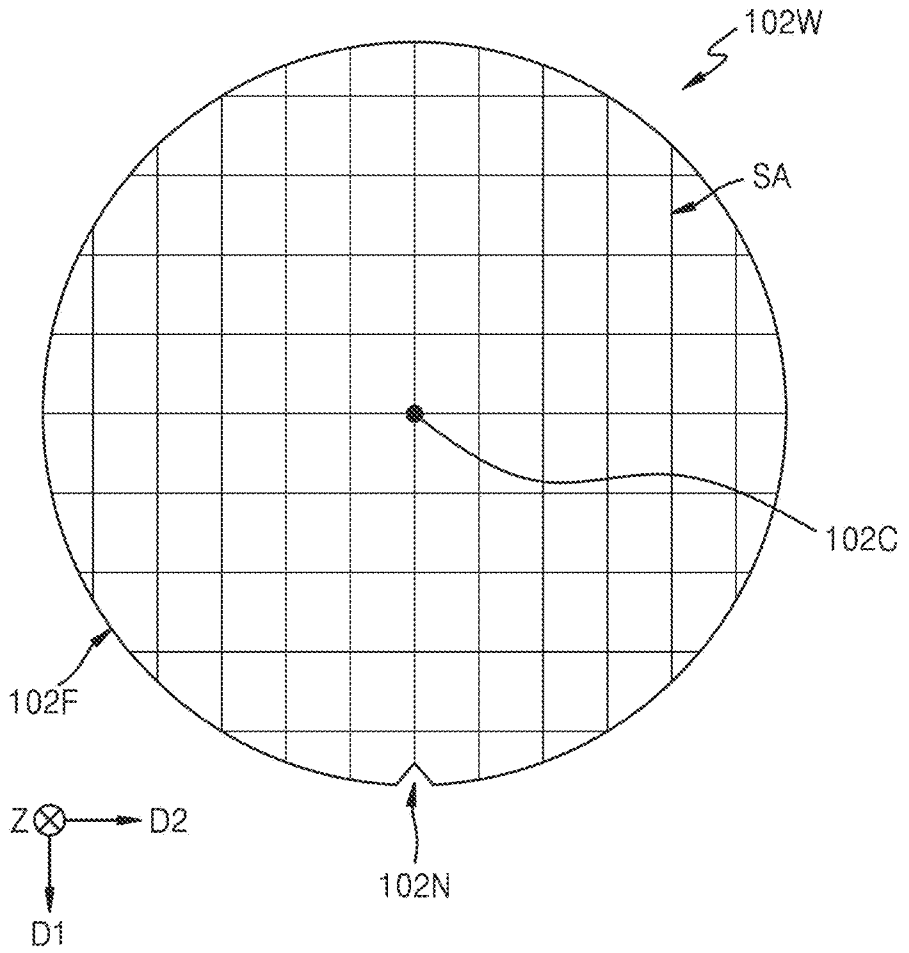
FIG. 3A is a plan view of a first wafer that may be used to form a first semiconductor substrate to be included in an IC device according to various example embodiments.
Figure 3B:
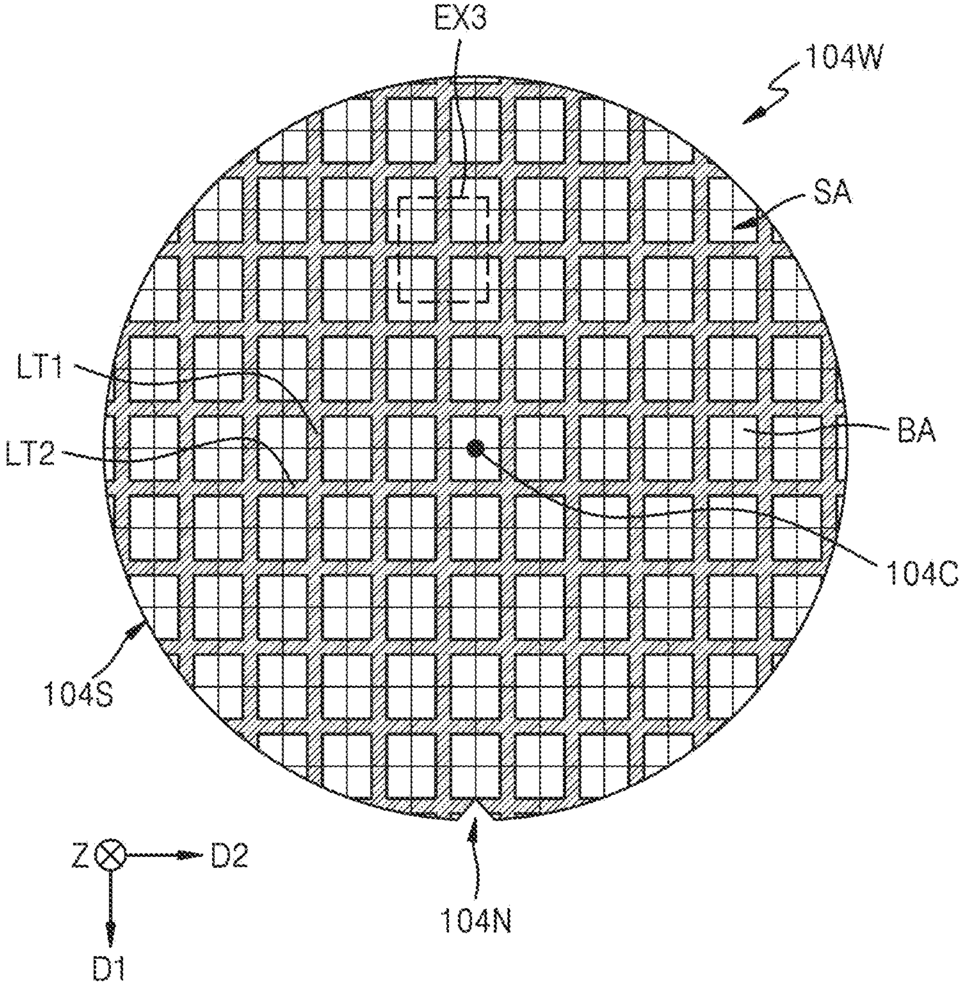
FIG. 3B is a plan view of a second wafer that may be used to form a second semiconductor substrate to be included in an IC device according to various example embodiments.

FIG. 3A is a plan view of a first wafer 102W that may be used to form the first semiconductor substrate 102 shown in FIG. 2, FIG. 3B is a plan view of a second wafer 104W that may be used to form the second semiconductor substrate 104 shown in FIG. 2. A size (or a diameter) of either or both of the first wafer 102W or the second wafer 104W may be 300 mm; however, example embodiments are not limited thereto, and a size (or diameter) of either or both of the first wafer 102W may be more than or less than 300 mm, such as 200 mm, or 450 mm. In various example embodiments, the first wafer 102W may have the same diameter as the second wafer 104W; example embodiments, however, are not limited thereto.

In various example embodiments, the first semiconductor substrate 102 shown in FIG. 2 may correspond to at least a portion of the first wafer 102W shown in FIG. 3A, and the second semiconductor substrate 104 shown in FIG. 2 may correspond to at least a portion of the second wafer 104W shown in FIG. 3B. As used herein, the first wafer 102W may be referred to as the first semiconductor substrate 102, and the second wafer 104W may be referred to as the second semiconductor substrate 104. As used herein, features of the first wafer 102W, which are described below, may be equally applied to the first semiconductor substrate 102. As used herein, features of the second wafer 104W, which are described below, may be equally applied to the second semiconductor substrate 104.

Referring to FIGS. 2, 3A, and 3B, each of the first wafer 102W and the second wafer 104W may include a plurality of shot areas SA. Each of the plurality of shot areas SA may refer to a region that is exposed by a single exposure process. The plurality of shot areas SA in the first wafer 102W and the plurality of shot areas SA in the second wafer 104W may have the same size and be located in the same positions, e.g., relative to an edge and/or a notch such as a flat and/or the notch 102N, and/or a flat and/or the notch 104N. Although the number of shot areas SA is illustrated in the figures and are shown to extend to an edge of both the first wafer 102W and the second wafer 104W, example embodiments are not limited thereto.

In various example embodiments, each of a frontside surface 102F of the first wafer 102W and a main surface of the second wafer 104W may include or be arranged as a (100) crystal plane, without being limited thereto. The first wafer 102W may include a notch 102N formed on an edge of the first wafer 102W in a radial direction from a center 102C of the first wafer 102W. The second wafer 104W may include a notch 104N formed on an edge (of the second wafer 104W) in a radial direction from a center 104C of the second wafer 104W.

In various example embodiments, the first semiconductor substrate 102 shown in FIG. 2 may be obtained from the first wafer 102W, and the second semiconductor substrate 104 shown in FIG. 2 may be obtained from the second wafer 104W. In some example embodiments, in the IC device 100 shown in FIG. 2, a structure in which the first semiconductor substrate 102 is aligned with the second semiconductor substrate 104 may be obtained when the center 102C of the first wafer 102W and the center 104C of the second wafer 104W are in one vertical line in a vertical direction (or the Z direction in FIG. 2), the notch 102N of the first wafer 102W and the notch 104N of the second wafer 104W overlap each other in the vertical direction (or the Z direction in FIG. 2), and the first wafer 102W is aligned with the second wafer 104W such that a first radial direction RA1 and a second radial direction RA1 are in the same direction.

The second wafer 104W may include a main surface 104S facing a first BEOL structure BS1, and the main surface 104S of the second wafer 104W may be locally bonded to the first BEOL structure BS1. As shown in FIG. 3B, the main surface 104S of the second wafer 104W may include a plurality of local trench regions LT1 and LT2 in which a plurality of trenches (e.g., a plurality of first trenches T1 and a plurality of second trenches T2 in FIGS. 4A to 4C) are formed, e.g., in a regular pattern, and a plurality of local bonding areas BA bonded to the first BEOL structure BS1. The remaining regions excluding the plurality of trenches may be bonded to the first BEOL structure BS1 in the plurality of local trench regions LT1 and LT2, of the main surface 104S of the second wafer 104W.

Figure 4A:
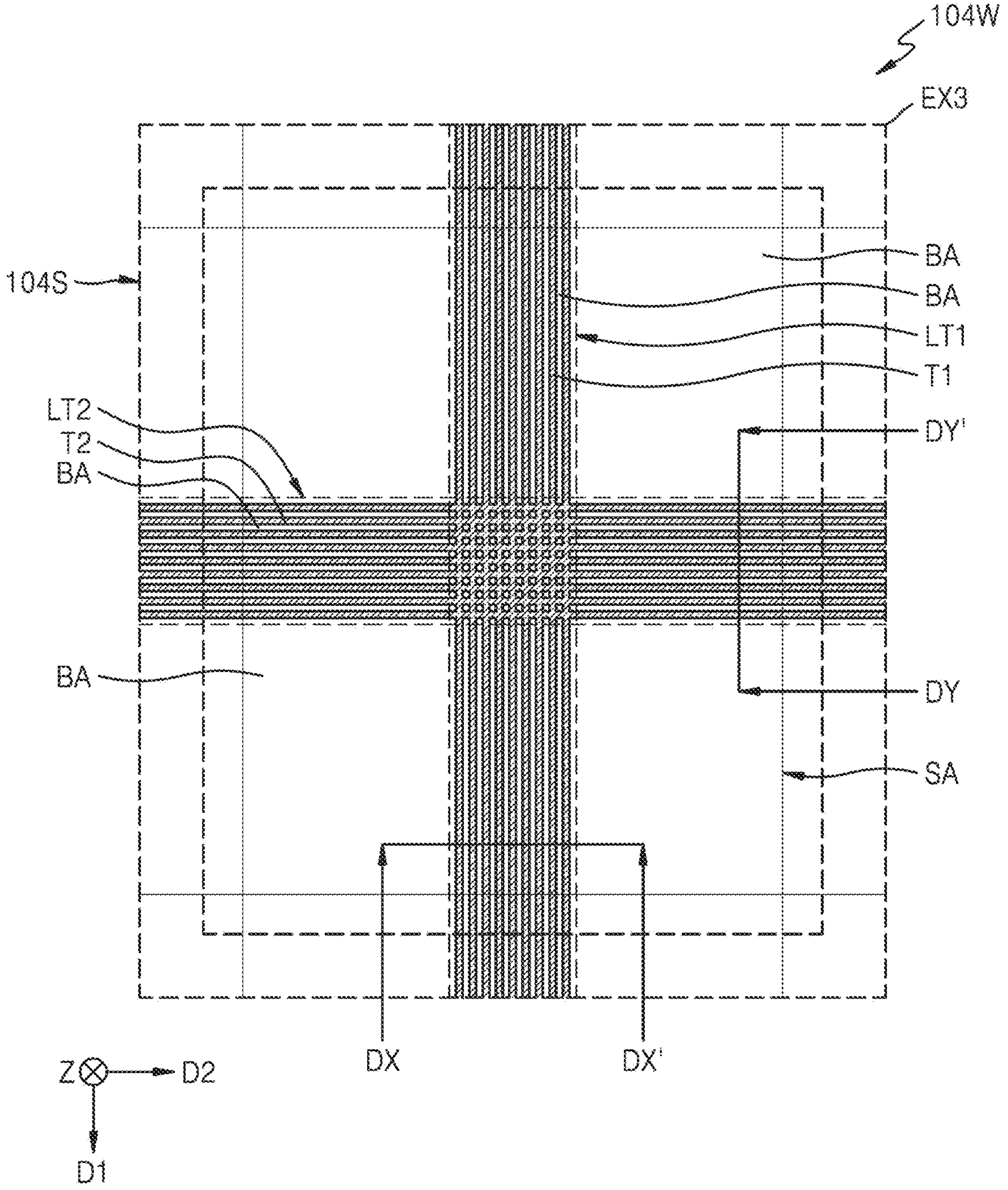
Figure 4B:
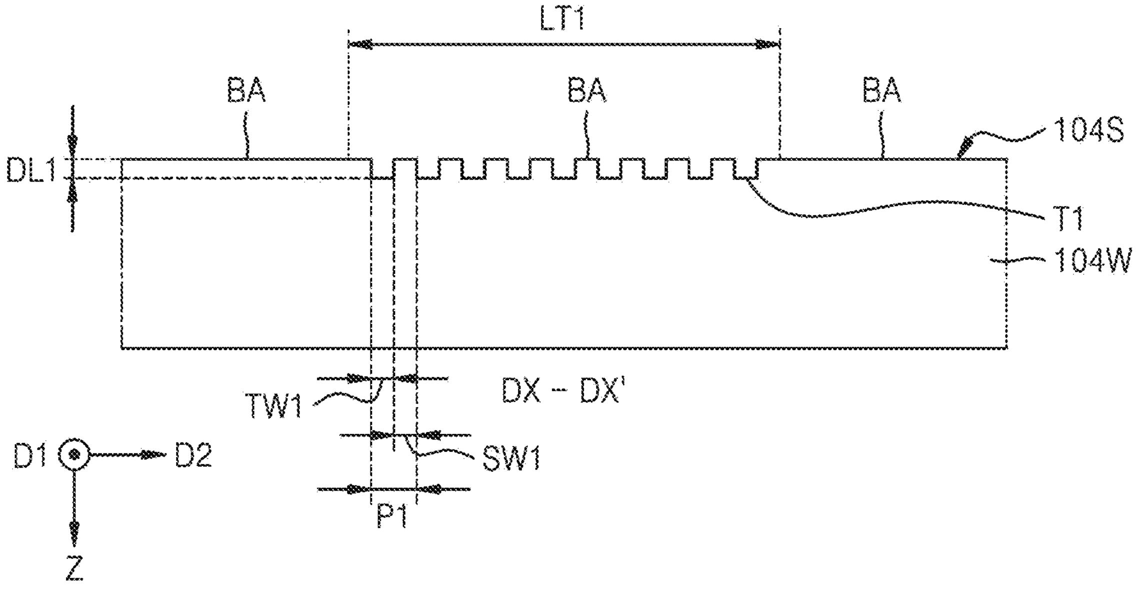
Figure 4C:
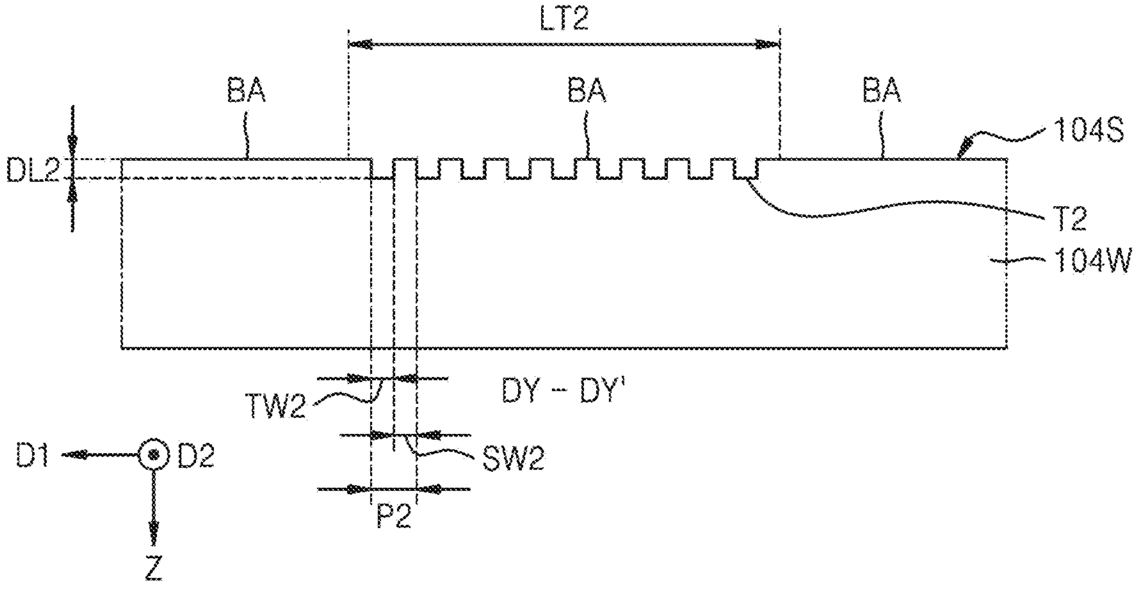

FIGS. 4A to 4C are detailed diagrams of the second wafer 104W shown in FIG. 3B. FIG. 4A is an enlarged plan view of region "EX3" of FIG. 3B. FIG. 4B is a cross-sectional view taken along line DX-DX' of FIG. 4A, and FIG. 4C is a cross-sectional view taken along line DY-DY' of FIG. 4A.

Referring to FIGS. 4A to 4C, in a main surface 104S of the second wafer 104W, a plurality of local trench regions LT1 and LT2 may include a plurality of first local trench regions LT1 and a plurality of second local trench regions LT2, which extend lengthwise in different directions to intersect each other. Each of the plurality of first local trench regions LT1 may include a plurality of first trenches T1, which extend long in a first direction (or D1 direction in FIGS. 4A to 4C). Each of the plurality of second local trench regions LT2 may include a plurality of second trenches T2, which extend lengthwise in a second lateral direction (or D2 direction in FIGS. 4A to 4C), which intersects the first direction (D1 direction). The first direction (D1 direction) and the second direction (D2 direction) may be perpendicular to each other; example embodiments are not limited thereto. In various example embodiments, the first direction (D1 direction) may be a direction parallel to a first radial direction from a center 104C of the second wafer 104W toward a notch 104N. The second direction (D2 direction) may correspond to a direction parallel to a second radial direction that is rotated by an angle of 90° from the first radial direction about the center 104C of the second wafer 104W. A number of first trenches T1 may be the same as, greater than, or less than a number of second trenches T2.

As shown in FIGS. 3B and 4A, in the main surface 104S of the second wafer 104W, each of the plurality of first local trench regions LT1 and the plurality of second local trench regions LT2 may extend long in a direction parallel to at least one side of at least one shot area SA.

Of the main surface 104S of the second wafer 104W, a plurality of local bonding areas BA may include surfaces excluding the plurality of first trenches T1 and the plurality of second trenches T2. An area occupied by the plurality of first trenches T1 and the plurality of second trenches T2 may be 20% or less of an area of the main surface 104S of the second wafer 104W. Similarly, the area occupied by the plurality of first trenches T1 and the plurality of second trenches T2 may be 20% or less in each of a plurality of shot areas SA included in the main surface 104S of the second wafer 104W. In various example embodiments, the area occupied by the plurality of first trenches T1 and the plurality of second trenches T2 may be about 5% to about 20% of the area of the main surface 104S of the second wafer 104W, without being limited thereto. Similarly, the area occupied by the plurality of first trenches T1 and the plurality of second trenches T2 may be about 5% to about 20% in each of the plurality of shot areas SA included in the main surface 104S of the second wafer 104W, without being limited thereto.

As shown in FIGS. 4B and 4C, in the main surface 104S of the second wafer 104W, a first width TW1 of each of the plurality of first trenches T1 and a second width TW2 of each of the plurality of second trenches T2 may each be independently selected in a range of about 300 nm to about 500 nm. A first pitch P1 of the plurality of first trenches T1 arranged in each of the plurality of first local trench regions LT1 and a second pitch P2 of the plurality of second trenches T2 arranged in each of the plurality of second local trench regions LT2 may each independently be selected in a range of about 600 nm to about 1 μm. The plurality of first trenches T1 arranged in each of the plurality of first local trench regions LT1 may have a first length DL1, which is selected in a range of about 100 nm to about 150 nm, in a vertical direction (Z direction). The plurality of second trenches T2 arranged in each of the plurality of second local trench regions LT2 may have a second length DL2, which is selected in a range of about 100 nm to about 150 nm, in the vertical direction (Z direction).

Figure 5:
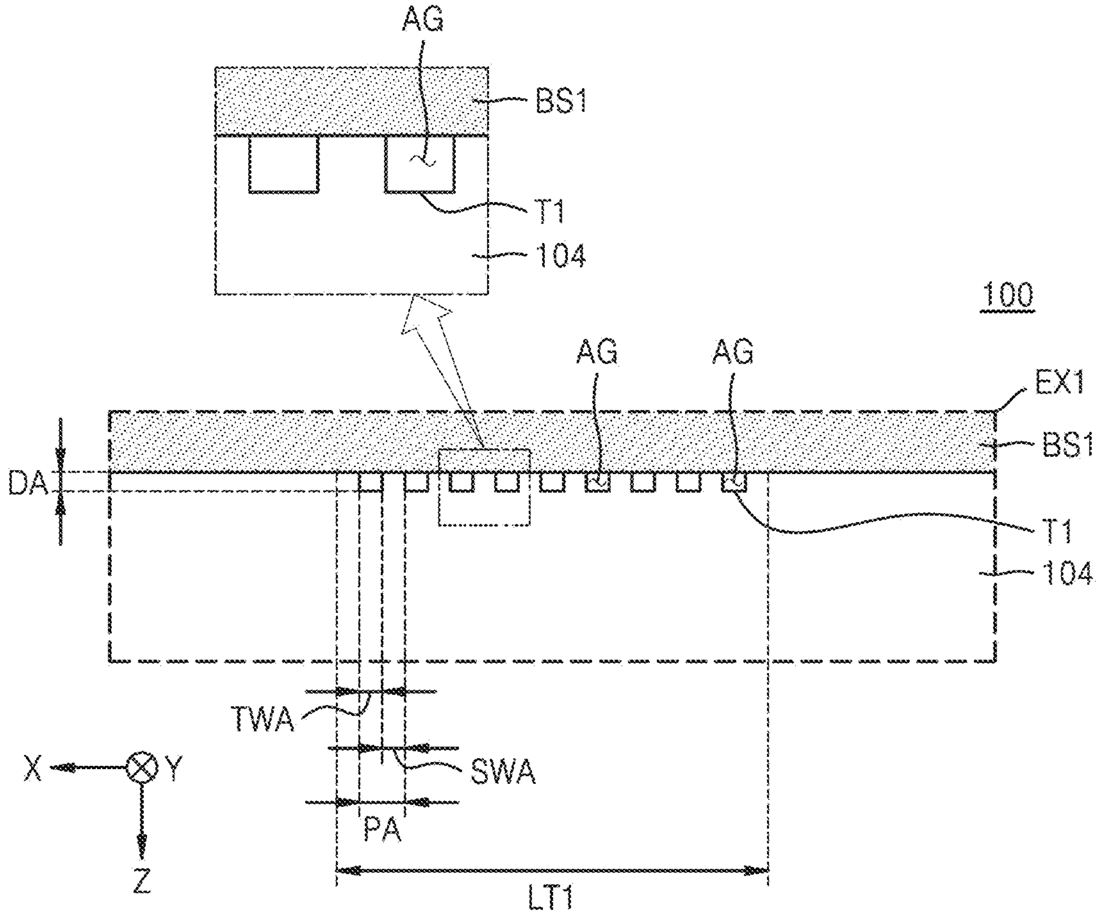
FIG. 5 is an enlarged cross-sectional view of a partial region "EX1" of FIG. 2.

FIG. 5 is an enlarged cross-sectional view of a partial region "EX1" of FIG. 2.

Referring to FIG. 5, an IC device 100 may include or define a plurality of first trenches T1 and a plurality of second trenches T2, which are formed in a second semiconductor substrate 104 between the second semiconductor substrate 104 and a first BEOL structure BS1, and a plurality of air gaps AG defined by the first BEOL structure BS1. As used herein, the term "air" may refer to space including the atmosphere and/or other gases that may be during a manufacturing process. An air gap may or may not be at vacuum.

A length DA of each of the plurality of air gaps AG in a vertical direction (Z direction) may be selected in a range of about 100 nm to about 150 nm. A width TWA of each of the plurality of air gaps AG may be selected in a range of about 300 nm to about 500 nm. A pitch PA of each of the plurality of air gaps AG may be selected in a range of about 600 nm to about 1 μm. Although the plurality of air gaps AG defined by the plurality of first trenches T1 are illustrated in FIG. 5, in the IC device 100, the plurality of air gaps AG defined by the plurality of second trenches T2 may be located between the second semiconductor substrate 104 and the first BEOL structure BS1 in a region that is not illustrated in FIG. 5. Details of the plurality of air gaps AG defined by the plurality of second trenches T2 are substantially the same as those of the plurality of air gaps AG defined by the plurality of first trenches T1 as described with reference to FIG. 5.

Although FIG. 5 illustrates an example in which each of the plurality of first trenches T1 and/or the plurality of air gaps AG substantially has a rectangular cross-sectional shape, example embodiments are not limited thereto. For example, a cross-sectional shape of each of or at least one of the plurality of first trenches T1 and/or the plurality of air gaps AG may have various cross-sectional shapes, such as a trapezoidal shape, a reverse trapezoidal shape, a triangular shape, a reverse triangular shape, and an elliptical shape.

In the second semiconductor substrate 104 included in the IC device 100 described with reference to FIG. 2 and the second wafer 104W described with reference to FIGS. 3B and 4A to 4C, a first width TW1 of each of the plurality of first trenches T1 arranged in each of a plurality of first local trench regions LT1 may be equal to or different from a second width TW2 of each of the plurality of second trenches T2 arranged in each of a plurality of second local trench regions LT2. A first pitch P1 of the plurality of first trenches T1 arranged in each of the plurality of first local trench regions LT1 may be equal to or different from a second pitch P2 of the plurality of second trenches T2 arranged in each of the plurality of second local trench regions LT2. In addition, a first length DL1 of the plurality of first trenches T1 arranged in each of the plurality of first local trench regions LT1 in the vertical direction (Z direction) may be equal to or different from a second length DL2 of the plurality of second trenches T2 arranged in each of the plurality of second local trench regions LT2 in the vertical direction (Z direction). The first width TW1, the second width TW2, the first pitch P1, the second pitch P2, the first length DL1, and the second length DL2 may each be variously selected according to bonding energy required between the second semiconductor substrate 104 and the first BEOL structure BS1 in a structure in which the main surface 104S of the second semiconductor substrate 104 is locally bonded to the first BEOL structure BS1, of the IC device described with reference to FIG. 2.

In general, bonding energy between two bonded wafers may be estimated according to Equation 1, based on the Maszara model. In a method of estimating bonding energy based on the Maszara model, a sharp blade may be inserted a distance (such as a dynamically determined, or, alternatively, predetermined) distance between bonding surfaces of the two bonded wafers. In this case, bonding strength may be calculated based on a peeling length L from a front tip of the blade.

$$\gamma = 3/8 \times (Et^3 y^2 / L^4) \quad [\mathrm{J/m^2}] \qquad \text{[Equation 1]}$$

wherein y denotes bonding strength per unit area, E denotes Young's modulus of a wafer, t denotes a thickness of the wafer or substrate, y denotes ½ a thickness of a blade, and L is a peeling length.

As can be seen from Equation 1, bonding strength between the wafers may increase as the value y in Equation 1 increases. It may be estimated that the greater an average distance between the bonded wafers, the greater the bonding strength between the wafers.

In the IC device 100 according to the inventive concept, as described above with reference to FIG. 5, the main surface 104S of the second semiconductor substrate 104 may be locally bonded to the first BEOL structure BS1, and the plurality of air gaps AG may be defined by the plurality of first trenches T1 and the plurality of second trenches T2, which are formed in the second semiconductor substrate 104 between the second semiconductor substrate 104 and the first BEOL structure BS1, and the first BEOL structure BS1. Thus, in the IC device 100, due to the plurality of air gaps AG, an average distance between the second semiconductor substrate 104 and the first BEOL structure BS1 may become greater than when the main surface 104S of the second semiconductor substrate 104 is entirely bonded to the first BEOL structure BS1. Accordingly, in the IC device 100, bonding strength between the second semiconductor substrate 104 and the first BEOL structure BS1 may become greater than when the main surface 104S of the second semiconductor substrate 104 is entirely bonded to the first BEOL structure BS1.

Figure 6:
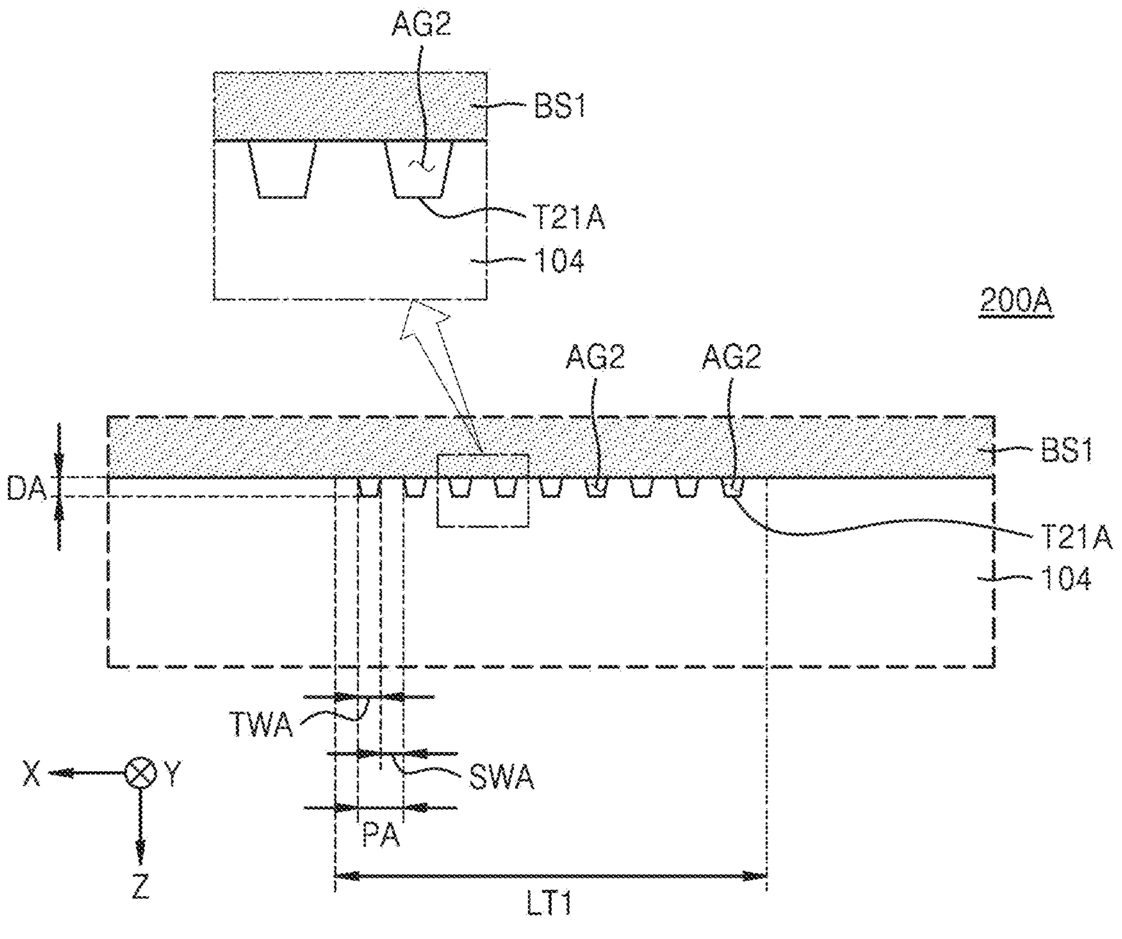
FIG. 6 is a cross-sectional view of an IC device according to various example embodiments.

FIG. 6 is a cross-sectional view of an IC device 200A according to various example embodiments. In FIG. 6, the same reference numerals are used to denote the same elements as in FIGS. 2 to 5, and thus, repeated descriptions thereof are omitted.

Referring to FIG. 6, the IC device 200A may substantially have the same configuration as the IC device 100 described with reference to FIGS. 2 to 5. However, in the IC device 200A, a plurality of first trenches T21A may be formed in a first local trench region LT1 of a second semiconductor substrate 104, and a plurality of air gaps AG2 defined by the plurality of first trenches T21A and a first BEOL structure BS1 may be arranged between the second semiconductor substrate 104 and the first BEOL structure BS1. Details of the plurality of first trenches T21A and the plurality of air gaps AG2 are respectively and substantially the same as those of the plurality of first trenches T1 and the plurality of air gaps AG, which are described with reference to FIGS. 4A and 5. However, each of the plurality of first trenches T21A and the plurality of air gaps AG2 may have a trapezoidal cross-sectional shape with a lateral width increasing toward the first BEOL structure BS1.

Figure 7A:
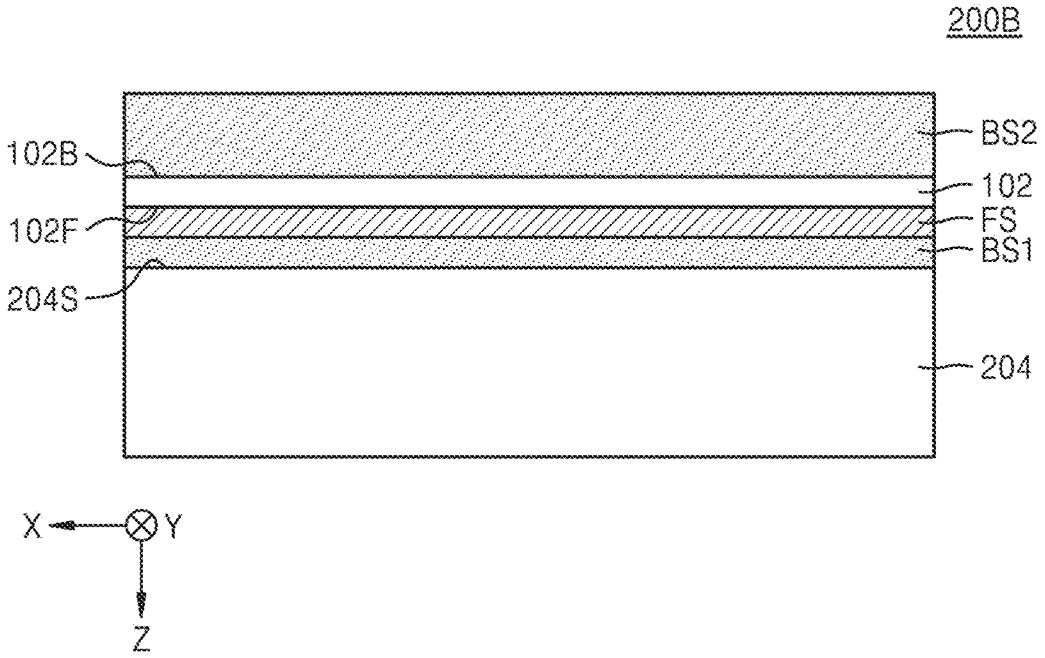
FIG. 7A is a cross-sectional view of an IC device according to various example embodiments.
Figure 7B:
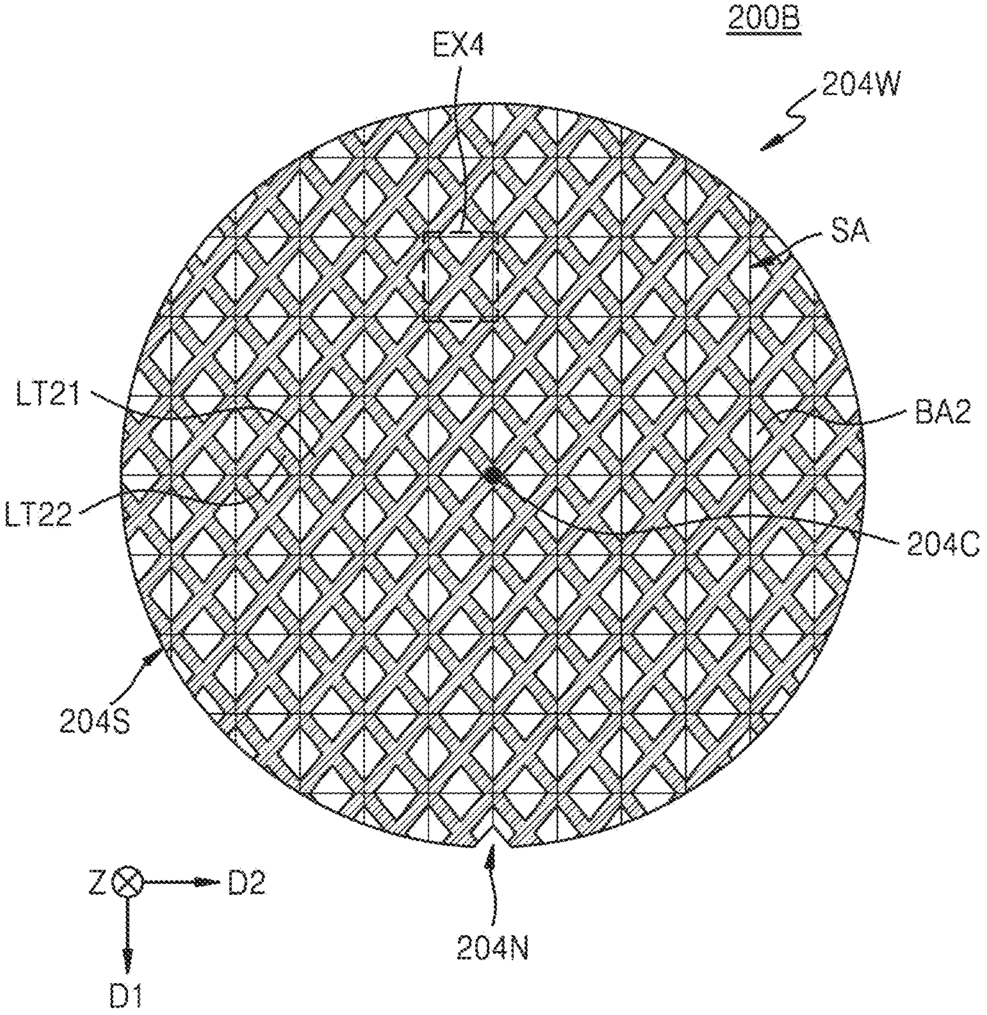
FIG. 7B is a plan view of a second wafer that may be used to form a second semiconductor substrate to be included in the IC device shown in FIG. 7A.
Figure 7C:
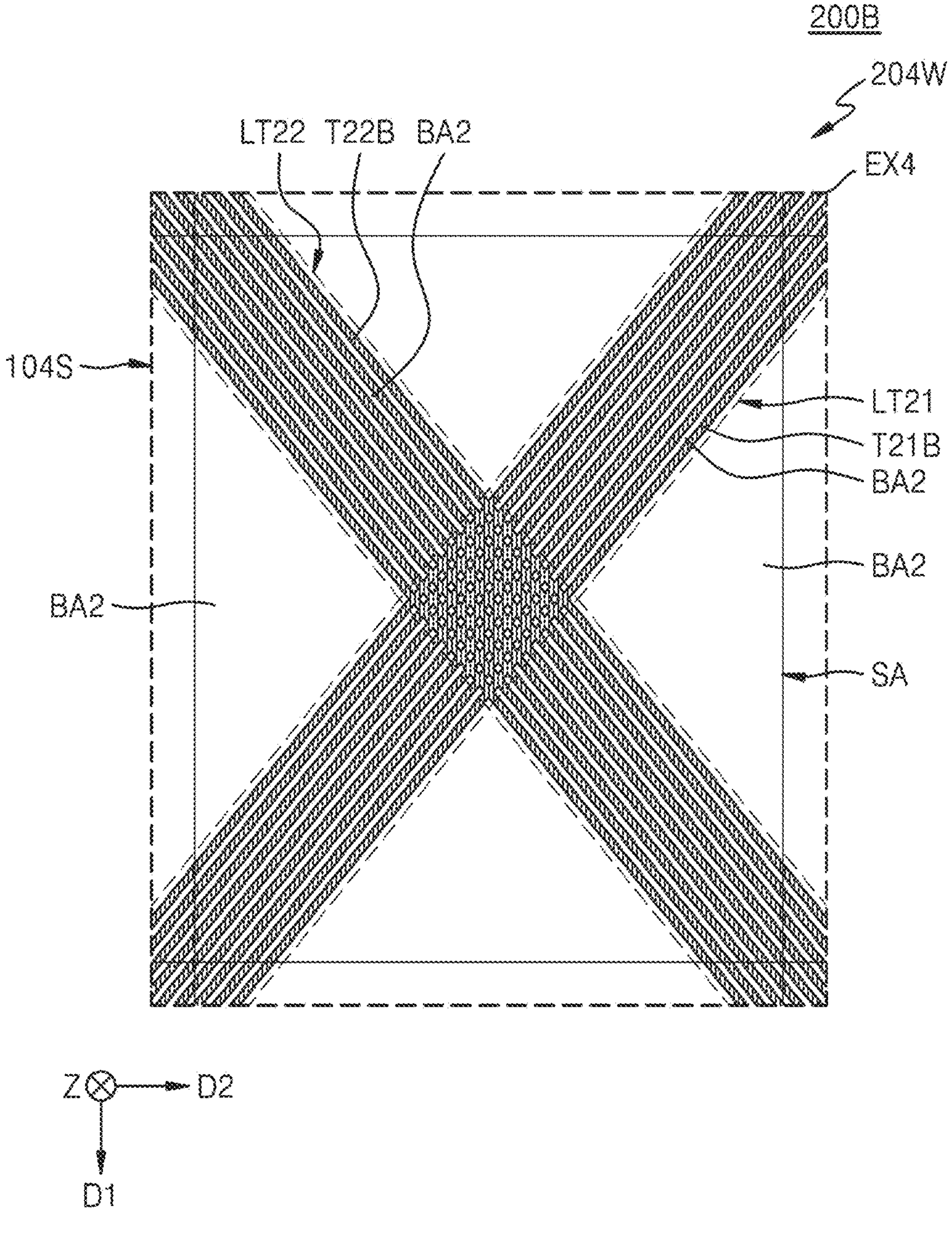
FIG. 7C is an enlarged plan view of region "EX4" of FIG. 7B.

FIGS. 7A, 7B, and 7C are diagrams of an IC device 200B according to various example embodiments. FIG. 7A is a cross-sectional view of the IC device 200B. FIG. 7B is a plan view of a second wafer 204W that may be used to form a second semiconductor substrate 204 to be included in the IC device 200B. FIG. 7C is an enlarged plan view of region "EX4" of FIG. 7B. In FIGS. 7A, 7B, and 7C, the same reference numerals are used to denote the same elements as in FIGS. 2 to 5, and thus, repeated descriptions thereof are omitted.

Referring to FIGS. 7A, 7B, and 7C, the IC device 200B may substantially have the same configuration as the IC device 100 described with reference to FIGS. 2 to 5. However, the IC device 200B may include the second semiconductor substrate 204 instead of the second semiconductor substrate 104.

The second semiconductor substrate 204 shown in FIG. 7A may correspond to at least a portion of the second wafer 204W shown in FIG. 7B. As used herein, the second wafer 204W may be referred to as the second semiconductor substrate 204. As used herein, features of the second wafer 204W, which are described below, may be equally applied to the second semiconductor substrate 204.

The second wafer 204W may include a notch 204N formed on an edge of the second wafer 204W in a radial direction from a center 204C of the second wafer 204W. The second wafer 204W may include a plurality of shot areas SA.

The second wafer 204W may include a main surface 204S, and the main surface 204S of the second semiconductor substrate 204 obtained from the second wafer 204W may face a first BEOL structure BS1. The main surface 204S of the second semiconductor substrate 204 may be locally bonded to the first BEOL structure BS1.

As shown in FIGS. 7B and 7C, the main surface 204S of the second wafer 204W may include a plurality of local trench regions LT21 and LT22 in which a plurality of trenches (e.g., a plurality of first trenches T21B and a plurality of second trenches T22B shown in FIG. 7C) are formed in a regular pattern, and a plurality of local bonding areas BA2 bonded to the first BEOL structure BS1. The remaining regions excluding the plurality of trenches may be bonded to the first BEOL structure BS1 in the plurality of local trench regions LT21 and LT22, of the main surface 204S of the second wafer 204W.

In the main surface 204S of the second wafer 204W, the plurality of local trench regions LT21 and LT22 may include a plurality of first local trench regions LT21 and a plurality of second local trench regions LT22, which extend long in different directions to intersect each other. Each of the plurality of first local trench regions LT21 may extend long in a direction parallel to a direction of one diagonal line of at least one shot area SA. In various example embodiments, the plurality of first local trench regions LT21 may include the plurality of first trenches T21B, which extend long in a direction parallel to a first diagonal line of at least one shot area SA. The plurality of second local trench regions LT22 may include the plurality of second trenches T22B, which extend long in a direction parallel to a second diagonal line that intersects the first diagonal line of the at least one shot area.

Details of respective sizes and/or respective cross-sectional shapes of the plurality of first trenches T21B included in the plurality of first local trench regions LT21 and the plurality of second trenches T22B included in the plurality of second local trench regions LT22 are substantially the same as those of the plurality of first trenches T1 and the plurality of second trenches T2, which are described with reference to FIGS. 4B and 4C. In some cases in the IC device 200B, a cross-sectional shape of each of the plurality of first trenches T21B included in the plurality of first local trench regions LT21 and the plurality of second trenches T22B included in the plurality of second local trench regions LT22 may be a trapezoidal shape similar to that of the plurality of first trenches T21A formed in the second semiconductor substrate 104 of the IC device 200A described with reference to FIG. 6.

In the main surface 204S of the second wafer 204W, the plurality of local bonding areas BA2 may include surfaces excluding the plurality of first trenches T21B and the plurality of second trenches T22B. An area occupied by the plurality of first trenches T21B and the plurality of second trenches T22B may be 20% or less of an area of the main surface 204S of the second wafer 204W. Similarly, the area occupied by the plurality of first trenches T21B and the plurality of second trenches T22B may be 20% or less in each of the plurality of shot areas SA included in the main surface 204S of the second wafer 204W. In various example embodiments, the area occupied by the plurality of first trenches T21B and the plurality of second trenches T22B may be about 5% to about 20% of the area of the main surface 204S of the second wafer 204W, without being limited thereto. Alternatively or additionally, the area occupied by the plurality of first trenches T21B and the plurality of second trenches T22B may be about 5% to about 20% in each of the plurality of shot areas SA included in the main surface 204S of the second wafer 204W, without being limited thereto.

Figure 8A:
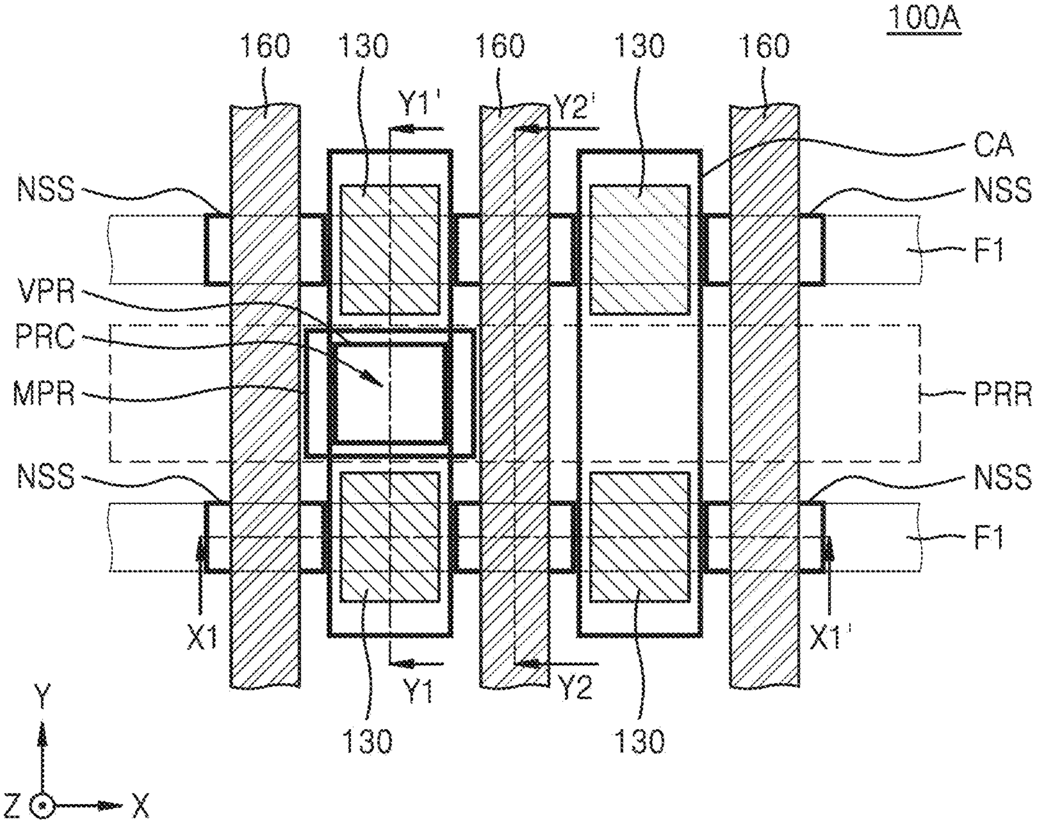
FIG. 8A is a plan layout diagram of a partial region of an IC device according to various example embodiments.
Figure 8B:
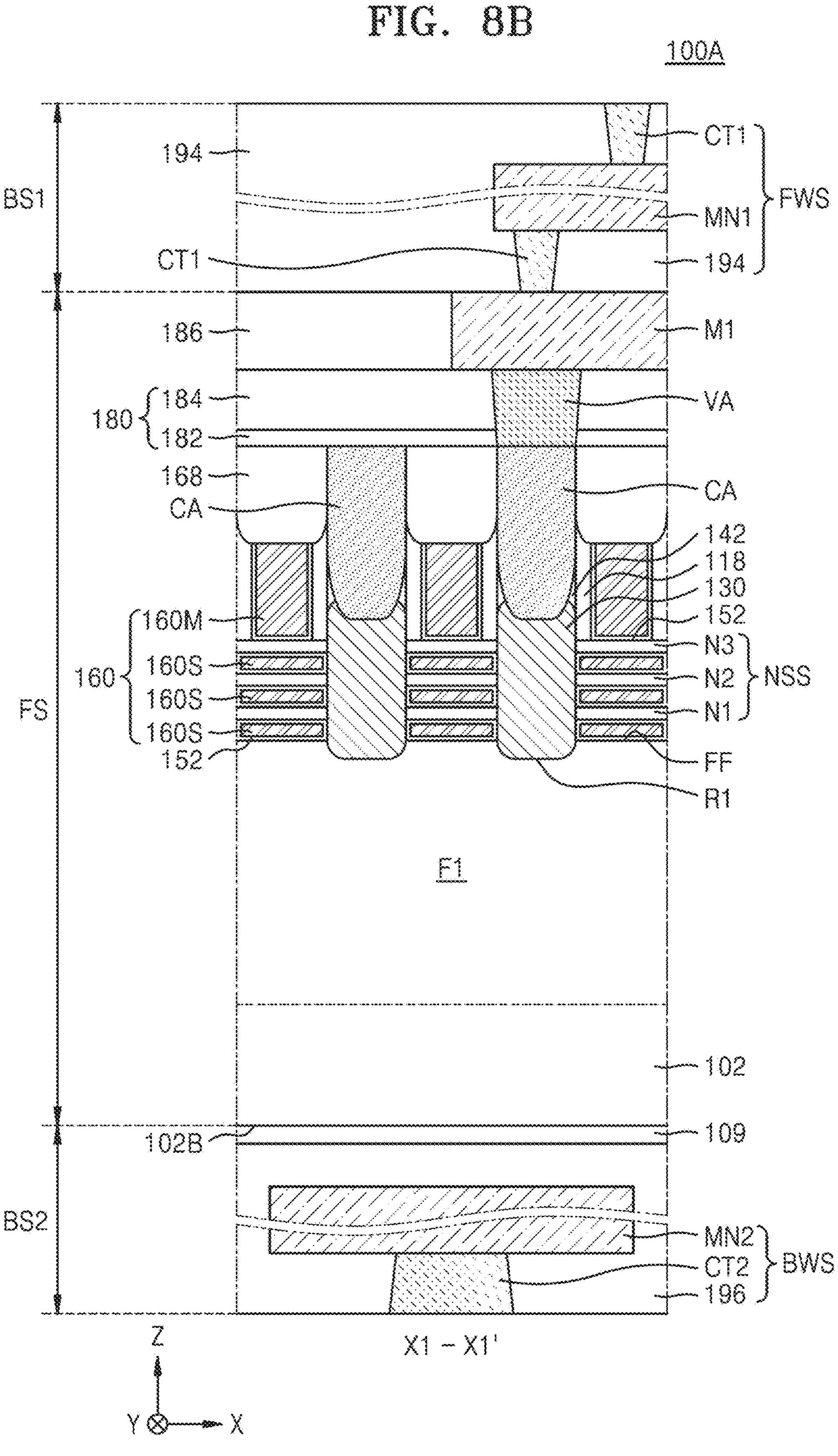
FIG. 8B is a cross-sectional view taken along line X1-X1' of FIG. 8A.
Figure 8C:
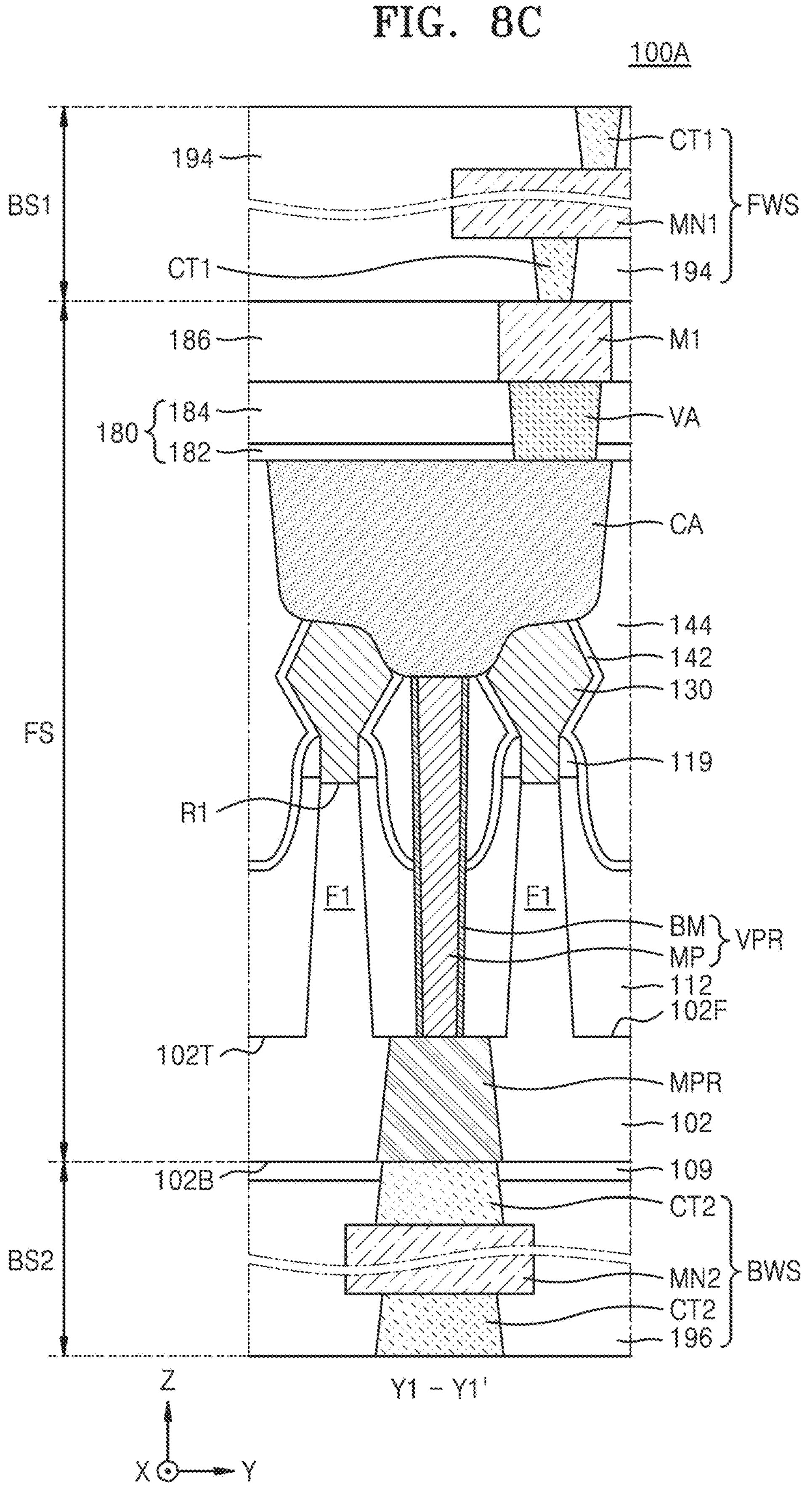
FIG. 8C is a cross-sectional view taken along line Y1-Y1' of FIG. 8A.
Figure 8D:
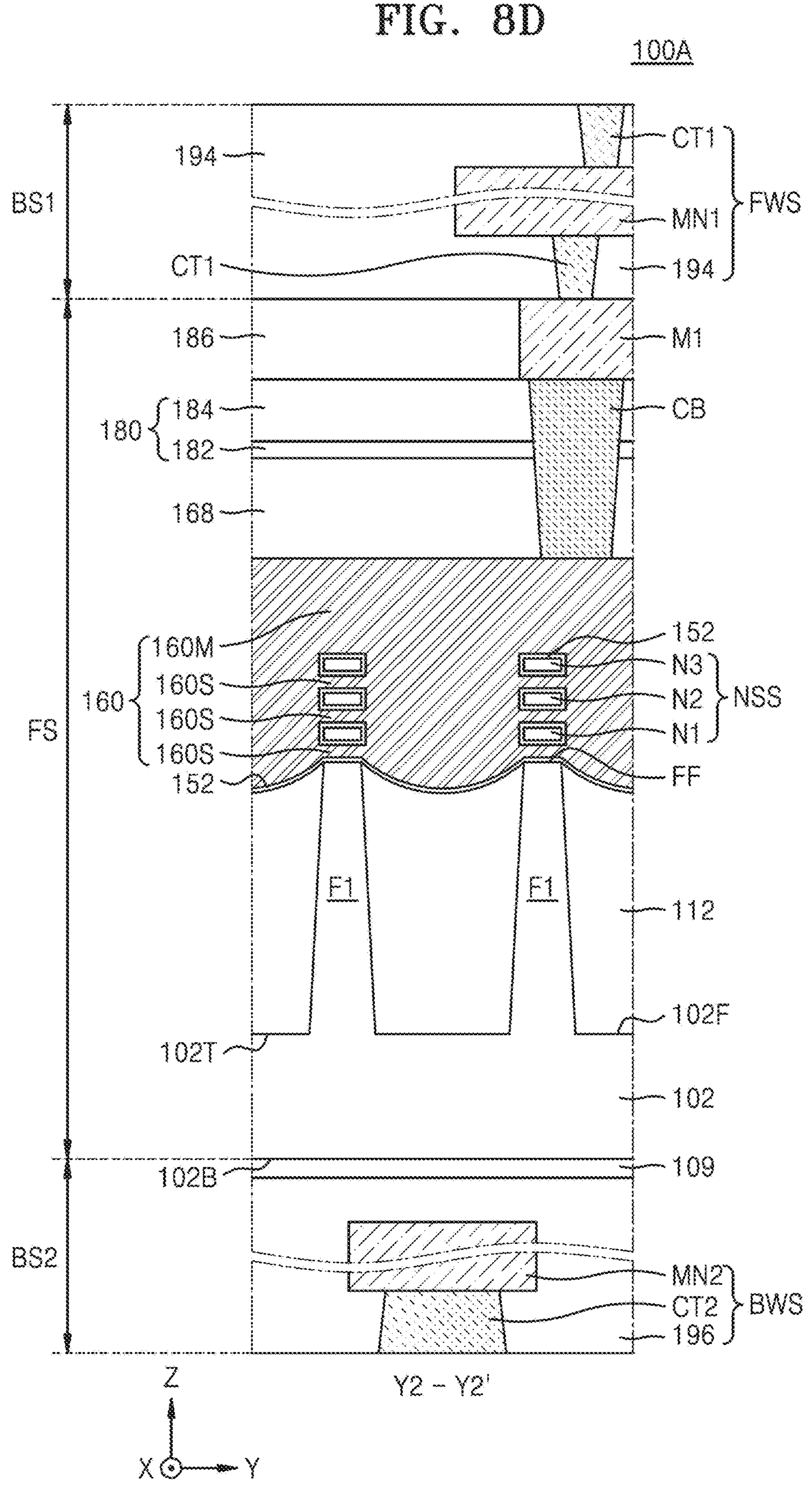
FIG. 8D is a cross-sectional view taken along line Y2-Y2' of FIG. 8A.

FIGS. 8A to 8D are diagrams of an IC device 100A according to various example embodiments, illustrating a specific configuration of an example of portion "EX2" of FIG. 2. More specifically, FIG. 8A is a plan layout diagram of a partial region of the IC device 100A according to various example embodiments. FIG. 8B is a cross-sectional view taken along line X1-X1' of FIG. 8A. FIG. 8C is a cross-sectional view taken along line Y1-Y1' of FIG. 8A. FIG. 8D is a cross-sectional view taken along line Y2-Y2' of FIG. 8A. The IC device 100A including field-effect transistor (FETs) having a gate-all-around (GAA) structure including an active area of a nanowire and/or nanosheet type and a gate surrounding the active area is now described with reference to FIGS. 8A to 8D. In FIGS. 8A to 8D, the same reference numerals are used to denote the same elements as in FIG. 2, and thus, repeated descriptions thereof are omitted. Of the IC device 100A, components shown in FIGS. 8A to 8D may constitute portions of the plurality of cells LC shown in FIG. 1.

Referring to FIGS. 8A to 8D, a first semiconductor substrate 102 may include a conductive region, for example, a doped well or a doped structure.

A plurality of fin-type active areas F1 may protrude from a frontside surface 102F of the first semiconductor substrate 102 in a vertical direction (Z direction). The plurality of fin-type active areas F1 may extend long in a first lateral direction (X direction) on the frontside surface 102F of the first semiconductor substrate 102 and be apart from other in a second lateral direction (Y direction) that is perpendicular to the first lateral direction (X direction). A plurality of trench regions 102T may be defined by the plurality of fin-type active areas F1 on the frontside surface 102F of the first semiconductor substrate 102.

As shown in FIG. 8A, the IC device 100A may include a power rail region PRR. The power rail region PRR may be apart from the plurality of fin-type active areas F1 in the second lateral direction (Y direction) and extend long in the first lateral direction (X direction). In the power rail region PRR, a power rail wiring MPR may be adjacent to a backside surface 102B of the first semiconductor substrate 102. In various example embodiments, the power rail wiring MPR may constitute the ground line VSS shown in FIG. 1. The power rail wiring MPR may pass through a portion of the first semiconductor substrate 102 from the backside surface 102B of the first semiconductor substrate 102 in the vertical direction (Z direction). The power rail region PRR and the power rail wiring MPR may constitute (or be included in) the second BEOL structure BS2 shown in FIG. 2.

In various example embodiments, the power rail wiring MPR may include a metal wiring layer. In some cases, the power rail wiring MPR may include the metal wiring layer and a conductive barrier film surrounding the metal wiring layer. The metal wiring layer may include ruthenium (Ru), cobalt (Co), tungsten (W), or a combination thereof. The conductive barrier film may include titanium (Ti), titanium nitride (TiN), tantalum (Ta), tantalum nitride (TaN), or a combination thereof.

As shown in FIGS. 8C and 8D, a device isolation film 112 may be between two adjacent ones of the plurality of fin-type active areas F1. The device isolation film 112 may fill the plurality of trench regions 102T and cover sidewalls of each of the plurality of fin-type active areas F1. The device isolation film 112 may include a silicon oxide film, without being limited thereto.

As shown in FIGS. 8B and 8D, a plurality of gate lines 160 may be on the plurality of fin-type active areas F1 and the device isolation film 112. The plurality of gate lines 160 may extend long in the second lateral direction (Y direction) to intersect the plurality of fin-type active areas F1, respectively. A plurality of nanosheet stacks NSS may be on fin top surfaces FF of the plurality of fin-type active areas F1 in regions where the plurality of fin-type active areas F1 intersect the plurality of gate lines 160. Each of the plurality of nanosheet stacks NSS may include at least one nanosheet, which is apart from the fin top surface FF of the fin-type active area F1 in the vertical direction (Z direction) and faces the fin top surface FF of the fin-type active area F1. As used herein, the term "nanosheet" refers to a conductive structure having a cross-section that is substantially perpendicular to a direction in which current flows. The nanosheet may be interpreted as including a nanowire.

Each of the plurality of nanosheet stacks NSS may include a first nanosheet N1, a second nanosheet N2, and a third nanosheet N3, which overlap each other in the vertical direction (Z direction) on the fin-type active area F1. The first nanosheet N1, the second nanosheet N2, and the third nanosheet N3 may be at different vertical distances (Z-directional distances) from the fin top surface FF of the fin-type active area F1. Each of the plurality of gate lines 160 may surround the first nanosheet N1, the second nanosheet N2, and the third nanosheet N3, which overlap each other in the vertical direction (Z direction). Each of the first nanosheet N1, the second nanosheet N2, and the third nanosheet N3 included in the nanosheet stack NSS may function as a channel region. In various example embodiments, the first nanosheet N1, the second nanosheet N2, and the third nanosheet N3 included in the nanosheet stack NSS may independently or collectively include a silicon (Si) layer, a silicon germanium (SiGe) layer, or a combination thereof.

As shown in FIGS. 8B and 8D, each of the plurality of gate lines 160 may include a main gate portion 160M and a plurality of sub-gate portions 160S. The main gate portion 160M may cover a top surface of the nanosheet stack NSS and extend long in the second lateral direction (Y direction). The plurality of sub-gate portions 160S may be integrally connected to the main gate portion 160M and respectively arranged between the first to third nanosheets N1, N2, and N3 and between the first nanosheet N1 and the fin top surface FF of the fin-type active area F1.

As shown in FIGS. 8B and 8C, a plurality of recesses R1 may be formed in the fin-type active area F1. A lowermost surface of each of the plurality of recesses R1 may be at a lower vertical level than the fin top surface FF of the fin-type active area F1. As used herein, the term "vertical level" refers to a distance from the frontside surface 102F of the first semiconductor substrate 102 in the vertical direction (Z direction or −Z direction).

A plurality of source/drain regions 130 may be respectively inside the plurality of recesses R. Each of the plurality of source/drain regions 130 may be on the fin-type active area F1 and be apart from the frontside surface 102F of the first semiconductor substrate 102 with the fin-type active area F1 therebetween in the vertical direction (Z direction). Each of the plurality of source/drain regions 130 may be adjacent to at least one gate line 160 selected from the plurality of gate lines 160. Each of the plurality of source/drain regions 130 may have surfaces that contact the first nanosheet N1, the second nanosheet N2, and the third nanosheet N3, which are included in the nanosheet stack NSS adjacent thereto.

Each of the plurality of source/drain regions 130 may include an epitaxially grown semiconductor layer. In various example embodiments, each of the plurality of source/drain regions 130 may include an epitaxially grown Si layer, an epitaxially grown SiC layer, or an embedded SiGe structure including a plurality of epitaxially grown SiGe layers. When the source/drain region 130 constitutes an NMOS transistor, the source/drain region 130 may include a SiC layer doped with an n-type dopant. The n-type dopant may be selected from at least one of phosphorus (P), arsenic (As), and antimony (Sb); example embodiments are not limited thereto. When the source/drain region 130 constitutes a PMOS transistor, the source/drain region 130 may include a SiGe layer doped with a p-type dopant. The p-type dopant may be selected from boron (B) and/or gallium (Ga); example embodiments are not limited thereto.

Each of the plurality of gate lines 160 may include a metal, a metal nitride, a metal carbide, or a combination thereof. The metal may be selected from one or more of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and/or tantalum nitride (TaN). The metal carbide may include titanium aluminum carbide (TiAlC). However, a material included in the plurality of gate lines 160 is not limited to the examples described above.

A gate dielectric film 152 may be between the nanosheet stack NSS and the gate line 160. The gate dielectric film 152 may include a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In various example embodiments, the interface dielectric film may be omitted. The high-k dielectric film may include a material having a higher dielectric constant than a silicon oxide film. For example, the high-k dielectric film may have a dielectric constant of about 10 to 25. The high-k dielectric film may include hafnium oxide, without being limited thereto.

Both sidewalls of each of the plurality of sub-gate portions 160S included in the plurality of gate lines 160 may be apart from the source/drain region 130 with the gate dielectric film 152 therebetween. The gate dielectric film 152 may be between the sub-gate portion 160S included in the gate line 160 and each of the first nanosheet N1, the second nanosheet N2, and the third nanosheet N3 and between the sub-gate portion 160S included in the gate line 160 and the source/drain region 130.

The plurality of nanosheet stacks NSS may be respectively on the fin top surfaces FF of the plurality of fin-type active areas F1 in regions where the plurality of fin-type active areas F1 intersect the plurality of gate lines 160. Each of the plurality of nanosheet stacks NSS may be apart from the fin-type active area F1 and face the fin top surface FF of the fin-type active area F1. A plurality of nanosheet transistors may be formed in portions where the plurality of fin-type active areas F1 intersect the plurality of gate lines 160. The plurality of nanosheet transistors may include an NMOS transistor, a PMOS transistor, or a combination thereof.

As shown in FIG. 8B, both sidewalls of the gate line 160 may be covered by a plurality of insulating spacers 118. Each of the plurality of insulating spacers 118 may cover a sidewall of the main gate portion 160M on the top surface of the nanosheet stack NSS. Each of the plurality of insulating spacers 118 may be apart from the gate line 160 with the gate dielectric film 152 therebetween. As shown in FIG. 8C, a plurality of recess-side insulating spacers 119 may be on the device isolation film 112. At least some of the plurality of recess-side insulating spacers 119 may cover sidewalls of the source/drain region 130. In various example embodiments, the plurality of recess-side insulating spacers 119 may be respectively and integrally connected to the insulating spacer 118 adjacent thereto. The plurality of insulating spacers 118 and the plurality of recess-side insulating spacers 119 may each independently or concurrently include silicon nitride, silicon oxide, silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein each of the terms SiCN, SiBN, SION, SiOCN, SiBCN, and SiOC refers to a material including elements included therein, without referring to a chemical formula representing a stoichiometric relationship.

A top surface of each of the gate line 160, the gate dielectric film 152, and the insulating spacer 118 may be covered by a capping insulating pattern 168. The capping insulating pattern 168 may include a silicon nitride film.

The plurality of source/drain regions 130, the device isolation film 112, the plurality of insulating spacers 118, and the plurality of recess-side insulating spacers 119 may be covered by an insulating liner 142. An inter-gate dielectric film 144 may be on the insulating liner 142. The inter-gate dielectric film 144 may be between a pair of source/drain regions 130, which are adjacent to each other, between a pair of gate lines 160, which are adjacent to each other in the first lateral direction (X direction). In various example embodiments, the insulating liner 142 may include silicon nitride, SiCN, SiBN, SION, SiOCN, SiBCN, or a combination thereof, without being limited thereto. The inter-gate dielectric film 144 may include a silicon oxide film, without being limited thereto. The device isolation film 112, the insulating liner 142, and the inter-gate dielectric film 144 may constitute an insulating structure.

As shown in FIGS. 8B and 8C, a plurality of source/drain contacts CA may be on the plurality of source/drain regions 130. Each of the plurality of source/drain contacts CA may be apart from the frontside surface 102F of the first semiconductor substrate 102 with the fin-type active area F1 and the source/drain region 130 therebetween in the vertical direction (Z direction).

Each of the plurality of source/drain contacts CA may be electrically connected to at least one source/drain region 130 selected from the plurality of source/drain regions 130. For example, as shown in FIG. 8C, one source/drain contact CA may be connected to two source/drain regions 130, which are adjacent to each other, without being limited thereto. As shown in FIG. 8A, the source/drain contact CA may extend long in the second lateral direction (Y direction) between a pair of gate lines 160, which are adjacent to each other in the first lateral direction (X direction). As shown in FIG. 8B, the source/drain contact CA may be apart from the main gate portion 160M of the gate line 160 adjacent thereto with the insulating spacer 118 therebetween in the first lateral direction (X direction).

In various example embodiments, the source/drain region 130 and the source/drain contact CA, which are connected to each other, may be in contact with each other. In other embodiments, a metal silicide film (not shown) may be between the source/drain region 130 and the source/drain contact CA, which are connected to each other. The metal silicide film may include a metal, which includes Ti, W, Ru, Nb, Mo, Hf, Ni, Co, Pt, Yb, Tb, Dy, Er, or Pd. For example, the metal silicide film may include titanium silicide, without being limited thereto.

In various example embodiments, the source/drain contact CA may include only a metal plug including a single metal. In other embodiments, the source/drain contact CA may include a metal plug and a conductive barrier film surrounding the metal plug. The metal plug may include molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof, without being limited thereto. The conductive barrier film may include a metal or a conductive metal nitride.

For example, the conductive barrier film may include titanium (Ti), tantalum (Ta), tungsten (W), titanium nitride (TiN), tantalum (TaN), tungsten nitride (WN), tungsten carbon nitride (WCN), titanium silicon nitride (TiSiN), tantalum silicon nitride (TaSiN), tungsten silicon nitride (WSiN), or a combination thereof, without being limited thereto.

As shown in FIG. 8C, the IC device 100A may include a via power rail VPR, which extends long in the vertical direction (Z direction) between the power rail wiring MPR and the source/drain contact CA. The via power rail VPR may include a portion passing through an insulating structure including the device isolation film 112, the insulating liner 142, and the inter-gate dielectric film 144 in the vertical direction (Z direction) and a portion passing through a portion of the frontside surface 102F of the first semiconductor substrate 102 in the vertical direction (Z direction). The portion of the via power rail VPR, which passes through the insulating structure in the vertical direction (Z direction), may include a conductive barrier film BM and a metal plug MP surrounded by the conductive barrier film BM. The via power rail VPR may constitute the second BEOL structure BS2 shown in FIG. 2. The metal plug MP may include molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof, without being limited thereto. The conductive barrier film BM may include Ti, Ta, W, TiN, TaN, WN, WCN, TiSiN, TaSiN, WSiN, or a combination thereof, without being limited thereto.

The power rail wiring MPR and the via power rail VPR may constitute a contact structure. Of the contact structure, the power rail wiring MPR may constitute a first plug portion passing through the first semiconductor substrate 102 in the vertical direction (Z direction), and the via power rail VPR may constitute a second plug portion passing through the insulating structure in the vertical direction (Z direction). An insulating spacer including an inorganic material (e.g., a silicon oxide film and a silicon nitride film) may be between the power rail wiring MPR and the first semiconductor substrate 102 and/or between the via power rail VPR and the insulating structure.

A top surface of each of the source/drain contact CA, a plurality of capping insulating patterns 168, the inter-gate dielectric film 144 may be covered by an upper insulating structure 180. The upper insulating structure 180 may include an etch stop film 182 and an upper insulating film 184, which are sequentially stacked on each of the source/drain contact CA, the plurality of capping insulating patterns 168, and the inter-gate dielectric film 144. The etch stop film 182 may include silicon carbide (SiC), silicon nitride (SiN), nitrogen-doped silicon carbide (SiC: N), silicon oxycarbide (SiOC), aluminum nitride (AlN), aluminum oxynitride (AlON), aluminum oxide (AlO), aluminum oxycarbide (AlOC), or a combination thereof. The upper insulating film 184 may include an oxide film, a nitride film, an ultralow-k (ULK) film having an ultralow dielectric constant K of about 2.2 to about 2.4, or a combination thereof. For example, the upper insulating film 184 may include a tetraethyl orthosilicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof, without being limited thereto.

As shown in FIGS. 8B and 8C, a source/drain via contact VA may be on the source/drain contact CA. The source/drain via contact VA may pass through the upper insulating structure 180 and contact the source/drain contact CA. Each of the plurality of source/drain regions 130 may be electrically connected to the source/drain via contact VA through the source/drain contact CA. A bottom surface of the source/drain via contact VA may be in contact with the top surface of the source/drain contact CA.

As shown in FIG. 8D, a gate contact CB may be on the gate line 160. The gate contact CB may be connected to the gate line 160 by passing through the upper insulating structure 180 and the capping insulating pattern 168 in the vertical direction (Z direction). A bottom surface of the gate contact CB may be in contact with a top surface of the gate line 160.

Each of the source/drain via contact VA and the gate contact CB may include a contact plug, which includes molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof, but a constituent material of the contact plug is not limited thereto. In various example embodiments, the source/drain via contact VA and the gate contact CB may further include a conductive barrier pattern surrounding a portion of the contact plug. The conductive barrier pattern included in the source/drain via contact VA and the gate contact CB may include a metal or a metal nitride. For example, the conductive barrier pattern may include Ti, Ta, W, TiN, TaN, WN, WCN, TiSiN, TaSiN, WSiN, or a combination thereof, without being limited thereto.

A top surface of each of the upper insulating structure 180, the source/drain via contact VA, and the gate contact CB may be covered by an interlayer insulating film 186. A constituent material of the interlayer insulating film 186 is substantially the same as that of the upper insulating film 184, which is described above. A plurality of upper wiring layers M1 may pass through the interlayer insulating film 186. Each of the plurality of upper wiring layers M1 may be connected to the source/drain via contact VA located thereunder or the gate contact CB. Each of the plurality of upper wiring layers M1 may include molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without being limited thereto.

A frontside wiring structure FWS may be on the plurality of upper wiring layers M1 and the interlayer insulating film 186. The frontside wiring structure FWS may include a plurality of wiring layers MN1, a plurality of via contacts CT1, and an interlayer insulating film 194 covering the plurality of wiring layers MN1 and plurality of via contacts CT1. The via power rail VPR may be connected to a selected one of the plurality of wiring layers MN1 through the source/drain contact CA, the source/drain via contact VA, the upper wiring layer M1, and the via contact CT1. A constituent material of the plurality of wiring layers MN1 and a constituent material of the plurality of via contacts CT1 are substantially the same as that of the plurality of upper wiring layers M1, which has been described above. A constituent material of the interlayer insulating film 194 is substantially the same as that of the upper insulating film 184, which has been described above.

The backside surface 102B of the first semiconductor substrate 102 may be covered by a backside insulating film 109. The backside insulating film 109 may include a silicon oxide film, a silicon nitride film, a silicon carbide film, a low-k dielectric film, or a combination thereof. The low-k dielectric film may include fluorine-doped silicon oxide, organosilicate glass, carbon-doped oxide, porous silicon oxide, porous organosilicate glass, a spin-on organic polymeric dielectric, a spin-on silicon-based polymeric dielectric, or a combination thereof, without being limited thereto.

A backside wiring structure BWS may be on the backside insulating film 109. The backside wiring structure BWS may include a plurality of wiring layers MN2, a plurality of via contacts CT2, and an interlayer insulating film 196 covering the plurality of wiring layers MN2 and the plurality of via contacts CT2. A selected one of the plurality of via contacts CT2 may have one end in contact through the backside insulating film 109 and another end in contact with a selected one of the plurality of wiring layers MN2. The power rail wiring MPR may be connected to a selected one of the plurality of wiring layers MN2 through the one via contact CT2. Constituent materials of the plurality of wiring layers MN2 and the plurality of via contacts CT2 are substantially the same as those of the plurality of upper wiring layers M1, which have been described above. A constituent material of the interlayer insulating film 196 is substantially the same as that of the upper insulating film 184, which is described above.

Figure 9A:
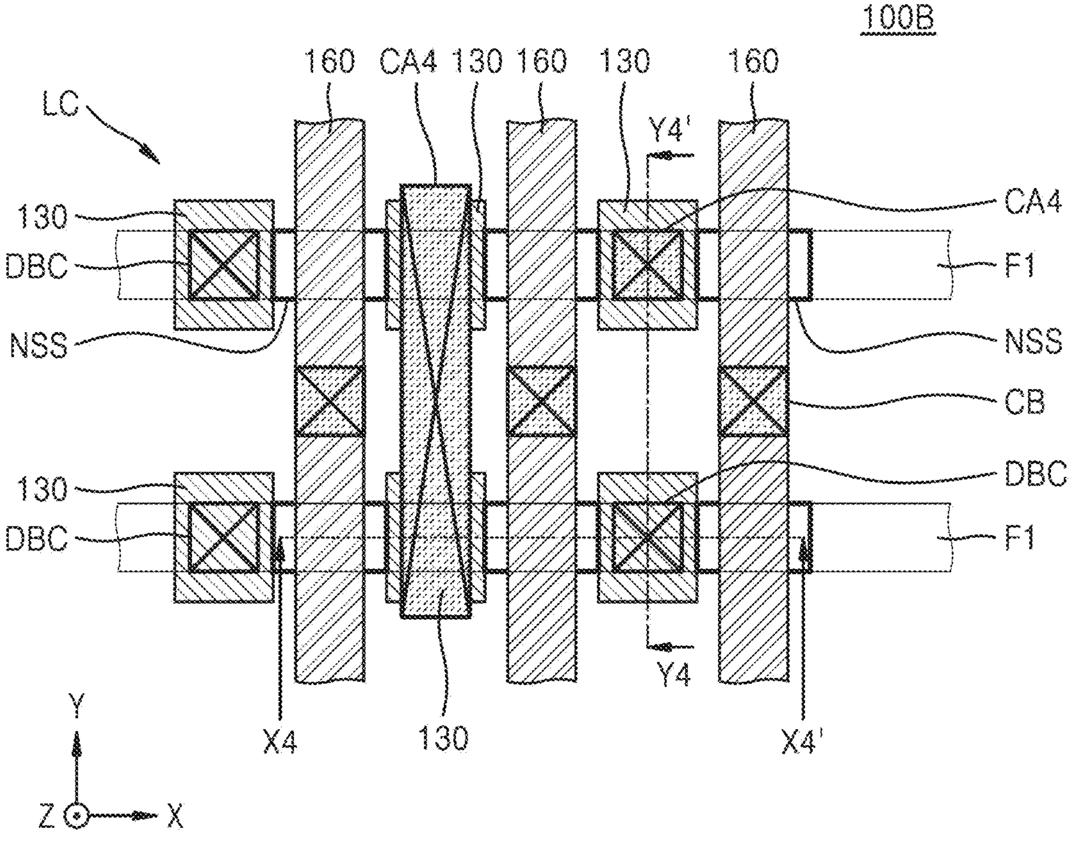
FIG. 9A is a plan layout diagram of a partial region of an IC device according to various example embodiments.
Figure 9B:
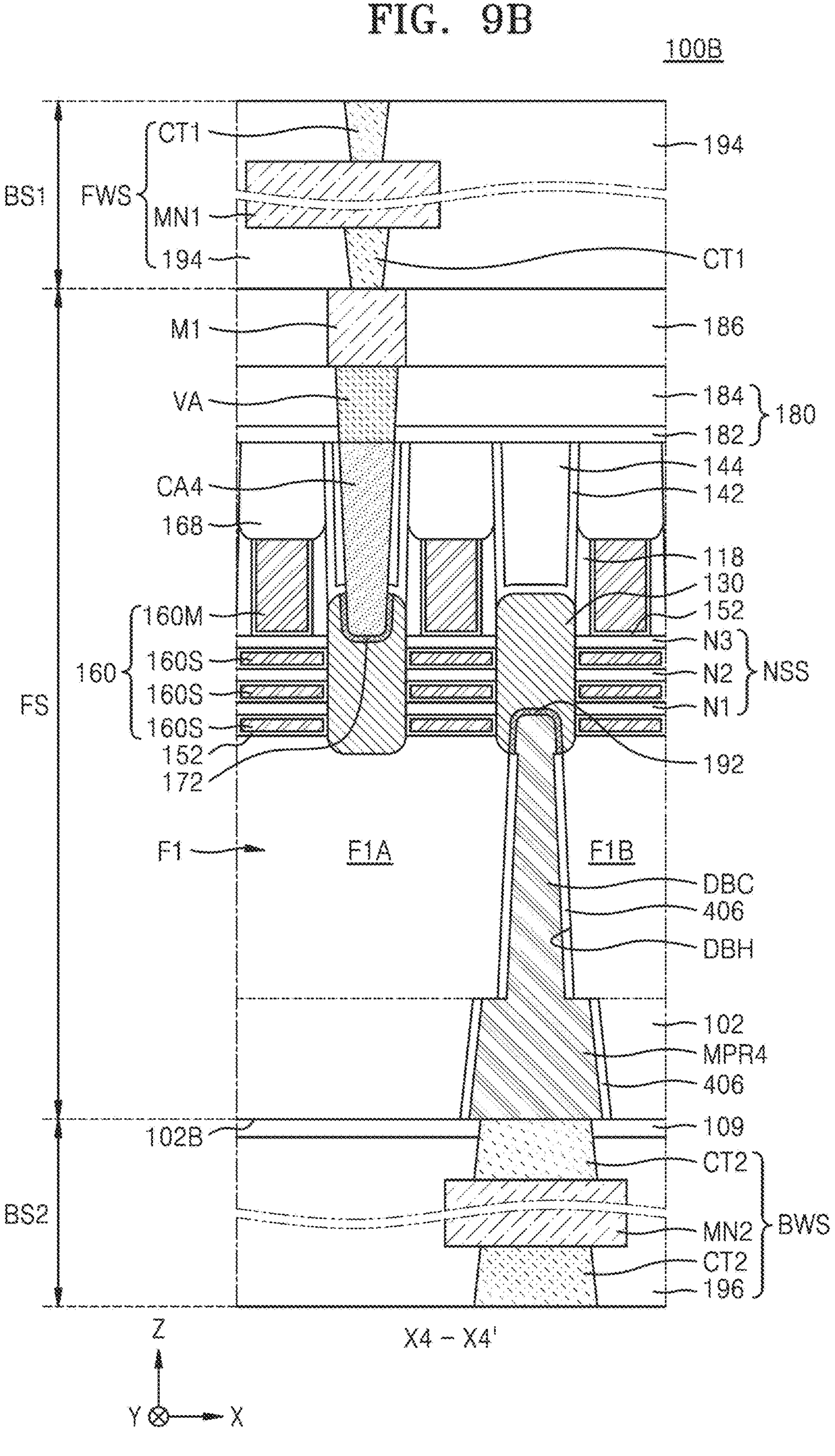
FIG. 9B is a cross-sectional view taken along line X4-X4' of FIG. 9A.
Figure 9C:
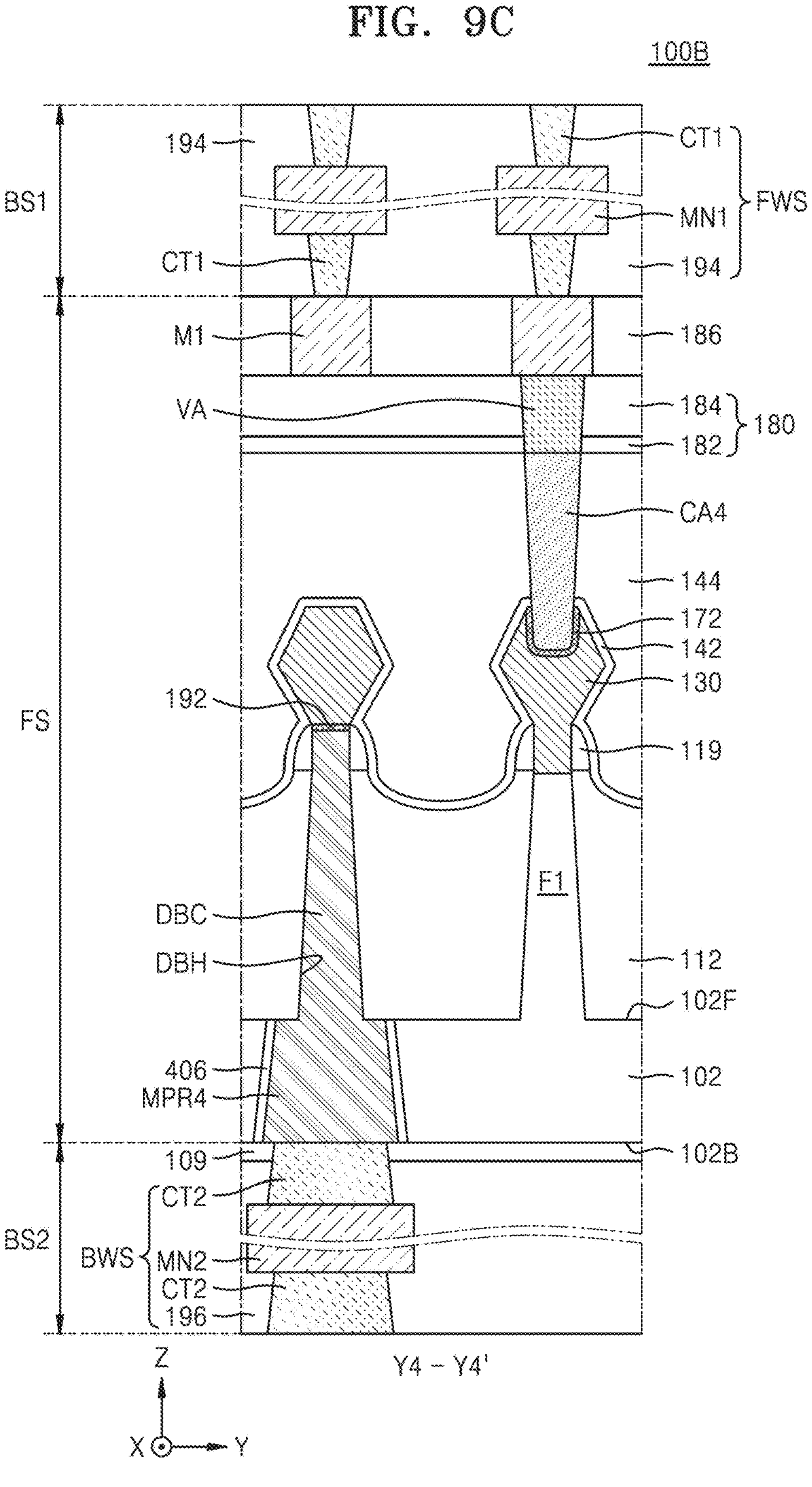
FIG. 9C is a cross-sectional view taken along line Y4-Y4' of FIG. 9A.

FIGS. 9A to 9C are diagrams of an IC device 100B according to various example embodiments, illustrating a specific configuration of another example of portion "EX2" of FIG. 2. More specifically, FIG. 9A is a plan layout diagram of a partial region of the IC device 100B. FIG. 9B is a cross-sectional view taken along line X4-X4' of FIG. 9A. FIG. 9C is a cross-sectional view taken along line Y4-Y4' of FIG. 9A. In FIGS. 9A to 9C, the same reference numerals are used to denote the same elements as in FIGS. 2 and 8A to 8D, and thus, repeated descriptions thereof are omitted.

Referring to FIGS. 9A to 9C, the IC device 100B may constitute some of the plurality of cells LC shown in FIG. 1. The IC device 100B may substantially have the same configuration as the IC device 100A described with reference to FIG. 8D. However, the IC device 100B may include a contact structure including a power rail wiring MPR4 and a backside source/drain contact DBC.

A selected one of the plurality of fin-type active areas F1 may include a first fin portion F1A and a second fin portion F1B, which are apart from each other in a first lateral direction (X direction), with the backside source/drain contact DBC included in the contact structure therebetween and extend long in a straight line in the first lateral direction (X direction). Each of the first fin portion F1A and the second fin portion F1B may have sidewalls covered by a device isolation film 112. The device isolation film 112 may constitute an insulating structure.

A plurality of gate lines 160 may be on the plurality of fin-type active areas F1. Each of the plurality of gate lines 160 may extend long in a second lateral direction (Y direction), which intersects the first lateral direction (X direction). A plurality of nanosheet stacks NSS may be respectively over the plurality of fin-type active areas F1 in regions where the plurality of fin-type active areas F1 intersect the plurality of gate lines 160.

A plurality of source/drain regions 130 may be on the plurality of fin-type active areas F1. Each of the plurality of source/drain regions 130 may be adjacent to at least one gate line 160 selected from the plurality of gate lines 160. Each of the plurality of source/drain regions 130 may be in contact with a first nanosheet N1, a second nanosheet N2, and a third nanosheet N3, which are included in the nanosheet stack NSS adjacent thereto.

As shown in FIG. 9C, a plurality of recess-side insulating spacers 119 may be on a top surface of the device isolation film 112. At least some of the plurality of recess-side insulating spacers 119 may cover sidewalls of the source/drain region 130. In various example embodiments, each of the plurality of recess-side insulating spacers 119 may be integrally connected to the insulating spacer 118 adjacent thereto.

A metal silicide film 172 may be formed on top surfaces of some selected ones of the plurality of source/drain regions 130 toward the upper insulating structure 180, and a metal silicide film 172 may be formed on bottom surfaces of some other selected ones of the plurality of source/drain regions 130 toward a first semiconductor substrate 102. The plurality of source/drain regions 130 and the device isolation film 112 may be covered by an insulating liner 142. An inter-gate dielectric film 144 may be on the insulating liner 142.

As shown in FIG. 9C, a plurality of frontside source/drain contacts CA4 may be on the fin-type active area F1. Each of the plurality of frontside source/drain contacts CA4 may be electrically connected to some source/drain regions 130 selected from the plurality of source/drain regions 130. Each of the plurality of frontside source/drain contacts CA4 may be apart from the fin-type active area F1 with the source/drain region 130 therebetween in a vertical direction (Z direction).

Each of the plurality of frontside source/drain contacts CA4 may pass through the inter-gate dielectric film 144 and the insulating liner 142 in the vertical direction (Z direction) and contact the metal silicide film 172. As shown in FIG. 9B, the frontside source/drain contact CA4 may be apart from a main gate portion 160M of the gate line 160 with the insulating spacer 118 therebetween in the first lateral direction (X direction). Details of the frontside source/drain contact CA4 are substantially the same as those of a source/drain contact CA, which are described with reference to FIGS. 2, 3A, and 3B.

A plurality of backside source/drain contacts DBC may be at a backside, which is opposite to a frontside at which the frontside source/drain contact CA4 is located, with the plurality of source/drain regions 130 therebetween. Each of the plurality of backside source/drain contacts DBC may be electrically connected to some other source/drain regions 130, which are selected from the plurality of source/drain regions 130 and are not connected to the frontside source/drain contact CA4.

Each of the plurality of backside source/drain contacts DBC may pass through a selected one of the plurality of fin-type active areas F1 in the vertical direction (Z direction). As described above, the selected fin-type active area F1 may include the first fin portion F1A and the second fin portion F1B, which are apart from each other in the first lateral direction (X direction) with the backside source/drain contact DBC therebetween and extend long in a straight line in the first lateral direction (X direction).

In the plurality of source/drain regions 130, the source/drain region 130 connected to the frontside source/drain contact CA4 may be apart from the source/drain region 130 connected to the backside source/drain contact DBC in a lateral direction (e.g., the first lateral direction (X direction) or the second lateral direction (Y direction)).

Each of the plurality of backside source/drain contacts DBC may have sidewalls facing each of the fin-type active areas F1, which is penetrated by the backside source/drain contact DBC in the vertical direction (Z direction), and the device isolation film 112 adjacent thereto.

As shown in FIG. 9B, the plurality of gate lines 160 may include a gate line 160 on the first fin portion F1A and a gate line 160 on the second fin portion F1B. Each of the plurality of frontside source/drain contacts CA4 may be connected to the source/drain region 130 located on the first fin portion F1A or the second fin portion F1B.

As shown in FIG. 9C, the device isolation film 112 may cover both sidewalls of each of the first fin portion F1A and the second fin portion F1B in the second lateral direction (Y direction) and define a width of a contact space DBH in the second lateral direction (Y direction). The backside source/drain contact DBC may overlap the source/drain region 130 in the vertical direction (Z direction) in the contact space DBH and extend long the vertical direction (Z direction) in the contact space DBH.

The backside source/drain contact DBC may have a width in each of the first lateral direction (X direction) and the second lateral direction (Y direction) gradually increasing toward the first semiconductor substrate 102 in the vertical direction (Z direction). As shown in FIGS. 9B and 9C, the frontside source/drain contact CA4 may have widths in the first lateral direction (X direction) and the second lateral direction (Y direction) gradually increasing away from the first semiconductor substrate 102 in the vertical direction (Z direction).

A metal silicide film 192 may be between the backside source/drain contact DBC and the source/drain region 130. Details of the metal silicide film 192 are substantially the same as those of the metal silicide film 172, which are described above.

As shown in FIG. 9C, in the contact space DBH, sidewalls of the backside source/drain contact DBC, which face the device isolation film 112, may be in contact with the device isolation film 112. As shown in FIG. 9B, in the contact space DBH, a self-assembly organic insulating liner SL4 may be between the backside source/drain contact DBC and the first fin portion F1A and between the backside source/drain contact DBC and the second fin portion F1B. The self-assembly organic insulating liner SL4 may be in contact with the backside source/drain contact DBC.

In the contact space DBH, an insulating film 406 may be between the first fin portion F1A and the backside source/drain contact DBC and an insulating film 406 may be between the second fin portion F1B and the backside source/drain contact DBC. Also, an insulating film 406 may be between the first semiconductor substrate 102 and the power rail wiring MPR4. The insulating film 406 may include a silicon oxide film.

In the IC device 100B, the power rail wiring MPR4 may pass through the first semiconductor substrate 102 in the vertical direction (Z direction) from a backside surface 102B of the first semiconductor substrate 102 to a frontside surface 102F thereof and be connected to the backside source/drain contact DBC. The backside source/drain contact DBC may include a first end portion connected to the power rail wiring MPR4 and a second end portion connected to the source/drain region 130 through a metal silicide film 192. In various example embodiments, the power rail wiring MPR4 may be integrally connected to the backside source/drain contact DBC. In various example embodiments, the power rail wiring MPR4 and the backside source/drain contact DBC may include the same metal. In various example embodiments, each of the power rail wiring MPR4 and the backside source/drain contact DBC may include a metal plug, which includes molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof.

The power rail wiring MPR4 and the backside source/drain contact DBC may constitute a contact structure. The power rail wiring MPR4, which passes through the first semiconductor substrate 102 in the vertical direction (Z direction), may constitute a first plug portion of the contact structure, and the backside source/drain contact DBC may constitute a second plug portion of the contact structure.

As shown in FIGS. 9B and 9C, a top surface of each of a plurality of frontside source/drain contacts CA4, a plurality of capping insulating patterns 168, and the inter-gate dielectric film 144 may be covered by the upper insulating structure 180. The upper insulating structure 180 may include an etch stop film 182 and an upper insulating film 184. A plurality of source/drain via contacts VA may be on the plurality of frontside source/drain contacts CA4. Each of the plurality of source/drain via contacts VA may pass through the upper insulating structure 180 and contact the frontside source/drain contact CA4. From among the plurality of source/drain regions 130, the source/drain region 130 connected to the frontside source/drain contact CA4 may be electrically connected to the source/drain via contact VA through the metal silicide film 172 and the frontside source/drain contact CA4. A top surface of the upper insulating structure 180 may be covered by an interlayer insulating film 186. A plurality of upper wiring layers M1 may pass through the interlayer insulating film 186. Each of the plurality of upper wiring layers M1 may be connected to a selected one of the plurality of source/drain via contacts VA located thereunder or a selected one of a plurality of gate contacts (refer to CB in FIG. 9A).

A frontside wiring structure FWS may be on the plurality of upper wiring layers M1 and the interlayer insulating film 186. The backside surface 102B of the first semiconductor substrate 102 may be covered by a backside insulating film 109. A backside wiring structure BWS may be on the backside insulating film 109.

Each of the IC devices 100, 100A, 100B, 200A, and 200B described with reference to FIGS. 2 to 9C may include the first semiconductor substrate 102 and a second semiconductor substrate 104, which are apart from each other with an FEOL structure FS and a first BEOL structure BS1 therebetween in the vertical direction (Z direction) and overlap each other in the vertical direction (Z direction). A main surface 104S or 204S of the second semiconductor substrate 104 or 204, which faces the first BEOL structure BS1, may include a plurality of local trench regions LT1 and LT2 or LT21 and LT22 in which a plurality of trenches (e.g., the plurality of first trenches T1 and the plurality of second trenches T2 shown in FIGS. 4A to 4C, the plurality of first trenches T21A shown in FIG. 6, or the plurality of first trenches T21B and the plurality of second trenches T22B shown in FIG. 7C) are formed in a regular pattern, and a plurality of local bonding areas BA or BA2 bonded to the first BEOL structure BS1. The main surface 104S or 204S of the second semiconductor substrate 104 or 204 may be locally bonded to the first BEOL structure BS1 in a region excluding the plurality of trenches. In the IC devices 100, 100A, 100B, 200A, and 200B having the above-described configurations according to inventive concepts, even when the first semiconductor substrate 102 gradually becomes thinner and sizes of patterns to be formed on the first semiconductor substrate 102 are reduced, bending distortion of the first semiconductor substrate 102, overlay errors between patterns formed at difference levels on the first semiconductor substrate 102, or overlay errors between patterns included in the FEOL structure FS and patterns included in a second BEOL structure BS2 may be minimized or reduced, and thus, overlay precision may improve. Therefore, according to the inventive concept, critical dimension (CD) uniformity of patterns required to or used for manufacture the IC devices 100, 100A, 100B, 200A, and 200B may improve, and/or reliability of the IC devices 100, 100A, 100B, 200A, and 200B may improve.

Alternatively or additionally, the IC devices 100, 100A, 100B, 200A, and 200B according to the inventive concept may include a plurality of air gaps AG or AG2, which are defined by the plurality of trenches, which are formed in the second semiconductor substrate 104 or 204, and the first BEOL structure BS1 between the second semiconductor substrate 104 or 204 and the first BEOL structure BS1. Accordingly, bonding strength between the second semiconductor substrate 104 or 204 and the first BEOL structure BS1 may improve, and thus, a stabilized bonding structure may be provided. As a result, reliability of the IC devices 100, 100A, 100B, 200A, and 200B may be further enhanced.

Figure 10:
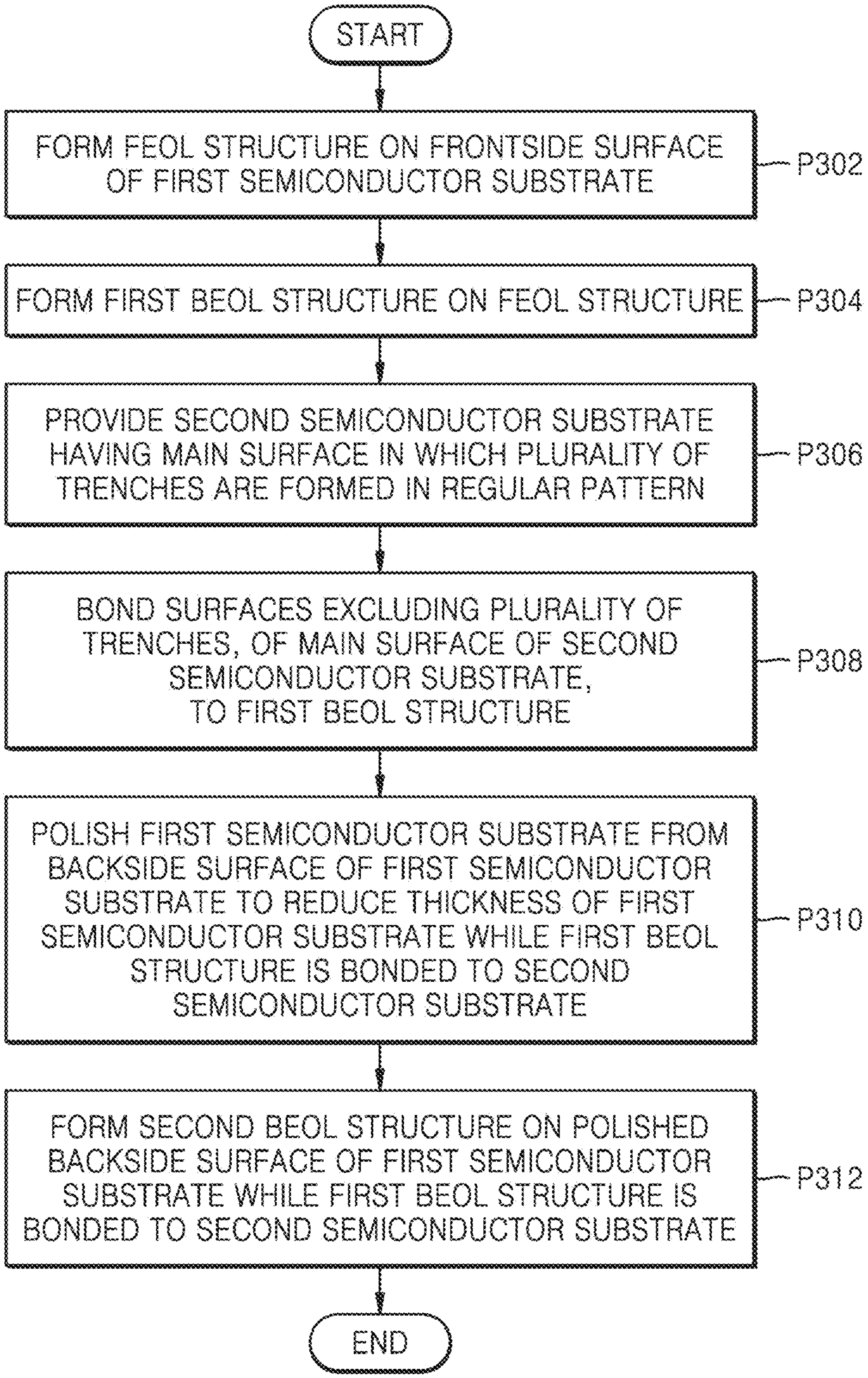
FIG. 10 is a flowchart of a method of manufacturing an IC device, according to various example embodiments.

FIG. 10 is a flowchart of a method of manufacturing an IC device, according to various example embodiments. FIGS. 11A to 11E are cross-sectional views showing a process sequence of a method of manufacturing an IC device, according to various example embodiments. A method of manufacturing the IC device 100 described with reference to FIG. 2 is described with reference to FIGS. 10 and 11A to 11E. In FIGS. 11A to 11E, the same reference numerals are used to denote the same elements as in FIG. 2, and thus, repeated descriptions thereof are omitted.

Figure 11A:
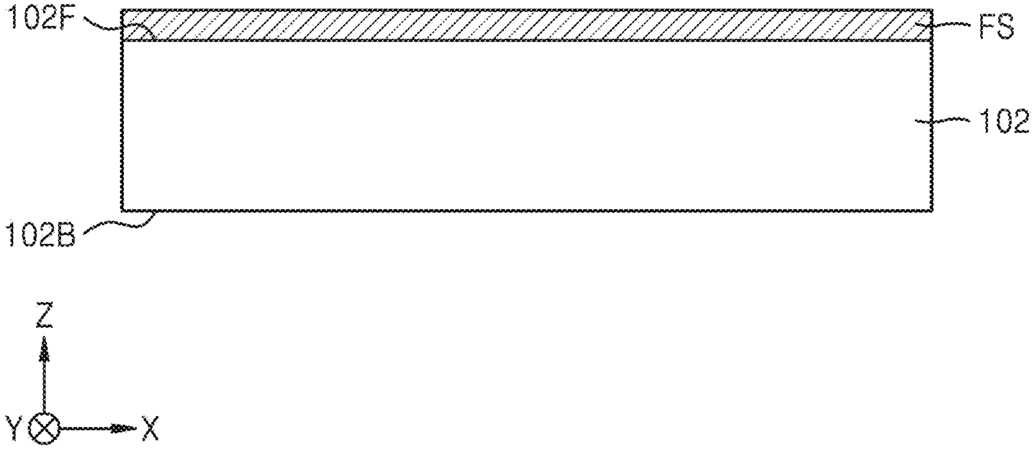
FIGS. 11A to 11E are cross-sectional views showing a process sequence of a method of manufacturing an IC device, according to various example embodiments.

Referring to FIGS. 10 and 11A, in process P302, a first semiconductor substrate 102 may be provided, and an FEOL structure FS may be formed on a frontside surface 102F of the first semiconductor substrate 102. The first semiconductor substrate 102 may include the first wafer 102W described with reference to FIG. 3A.

In various example embodiments, the FEOL structure FS may be formed to include components of the IC device 100A, which are described with reference to FIGS. 8A to 8D, and/or components of the IC device 100B, which are described with reference to FIGS. 9A to 9C.

Figure 11B:
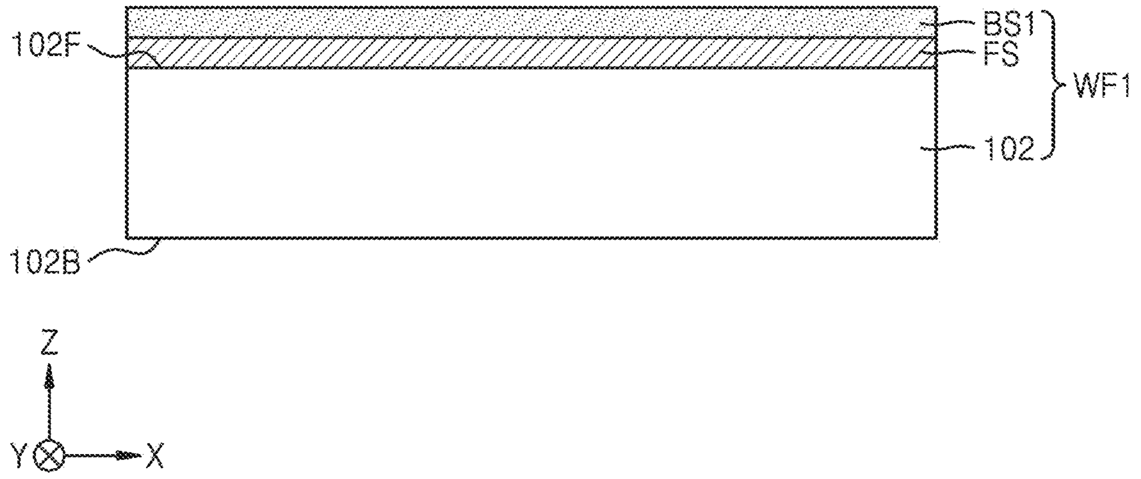

Referring to FIGS. 10 and 11B, in process P304, a first BEOL structure BS1 may be formed on the FEOL structure FS. In various example embodiments, the first BEOL structure BS1 may be formed to include a frontside wiring structure FWS described with reference to FIGS. 8A to 8D and 9A to 9C. As used herein, as shown in FIG. 11B, a structure in which the FEOL structure FS and the first BEOL structure BS1 are sequentially formed on the first semiconductor substrate 102 may be referred to as a first wafer structure WF1.

In process P306 of FIG. 10, a second semiconductor substrate 104 having a main surface 104S on which a plurality of trenches (e.g., the plurality of first trenches T1 and the plurality of second trenches T2 shown in FIGS. 4A to 4C) are formed in a regular pattern may be provided. In various example embodiments, the second semiconductor substrate 104 may include the second wafer 104W described with reference to FIGS. 3B and 4A to 4C.

The formation of the plurality of first trenches T1 and the plurality of second trenches T2 shown in FIGS. 4A to 4C in the main surface 104S of the second semiconductor substrate 104 may include forming a bottom antireflective coating (BARC) layer on a bare wafer including silicon (Si), forming a photoresist pattern on the BARC layer, and etching a partial region of the bare wafer by using the photoresist pattern as an etch mask. In various example embodiments, to form the photoresist pattern, an exposure process using a krypton fluoride (KrF) excimer laser (248 nm) may be performed, without being limited thereto.

In some example embodiments, the second semiconductor substrate 104 shown in FIG. 6 may be provided instead of the second semiconductor substrate 104 shown in FIG. 2. In some example embodiments, the second semiconductor substrate 204 or the second wafer 204W described with reference to FIGS. 7A to 7C may be provided instead of the second semiconductor substrate 104 shown in FIG. 2.

Figure 11C:
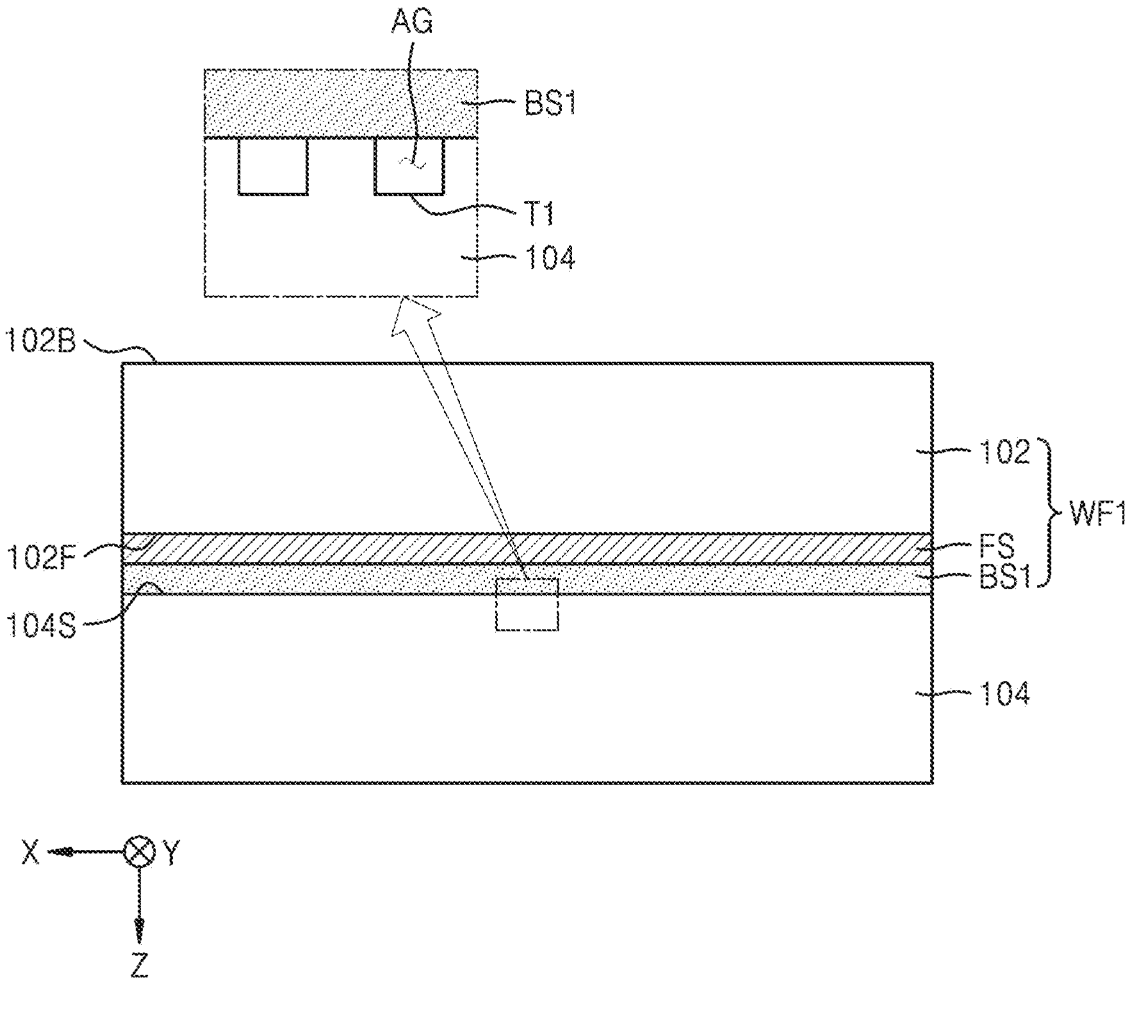

Referring to FIGS. 10 and 11C, in process P308, after the main surface 104S of the second semiconductor substrate 104 is aligned to face the first BEOL structure BS1, of the main surface 104S of the second semiconductor substrate 104, surfaces excluding the plurality of trenches (e.g., the plurality of first trenches T1 and the plurality of second trenches T2 shown in FIGS. 4A to 4C) may be bonded to the first BEOL structure BS1.

In various example embodiments, to bond the first BEOL structure BS1 to the second semiconductor substrate 104, firstly, each of a bonding target surface of the first BEOL structure BS1 and the main surface 104S of the second semiconductor substrate 104 may be cleaned with plasma, and the second semiconductor substrate 104 may be bonded under pressure to the first BEOL structure BS1 such that the main surface 104A of the second semiconductor substrate 104 contacts the first BEOL structure BS1. Thereafter, an annealing process may be performed.

To perform a plasma cleaning process on the bonding target surface of the first BEOL structure BS1 and the main surface 104S of the second semiconductor substrate 104, firstly, plasma and deionized water may be supplied to the bonding target surface of the first BEOL structure BS1 and the main surface 104S of the second semiconductor substrate 104 in a surface treatment chamber. A process gas for forming the plasma may include nitrogen, oxygen, argon, helium, or a combination thereof. The deionized water may be supplied simultaneously with the plasma into the surface treatment chamber, or the deionized water and the plasma may be sequentially or alternately supplied into the surface treatment chamber. The plasma may remove contaminants from the bonding target surface of the first BEOL structure BS1 and the main surface 104S of the second semiconductor substrate 104, and the deionized water may serve as a medium for chemical bonding. More specifically, the plasma may break Si—O bonds in a silicon oxide film that is exposed to the bonding target surface of the first BEOL structure BS1 and a bonding target surface of the second semiconductor substrate 104 in a vacuum state, and thus, —Si groups may be exposed to the bonding target surface. The deionized water may supply moisture ($H_2O$) to the bonding target surface to form-OH groups on the bonding target surface. Accordingly, the —Si groups present in the bonding target surface may remain bonded to the —OH groups.

As described above, by drying the first BEOL structure BS1 and the second semiconductor substrate 104, which are cleaned with plasma, excess moisture may be removed from the bonding target surface of each of the first BEOL structure BS1 and the second semiconductor substrate 104.

Figure 12A:
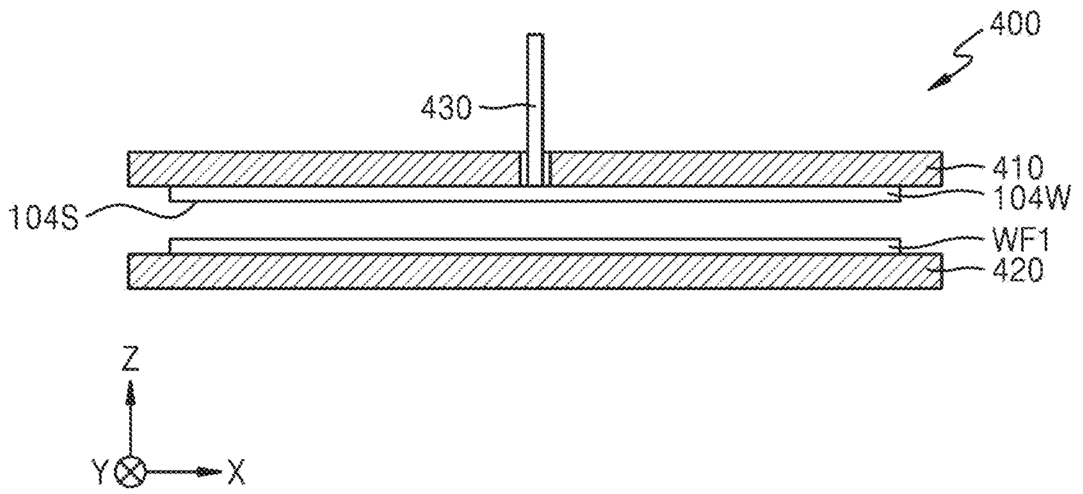
FIGS. 12A and 12B are cross-sectional views showing a process sequence of a method of bonding a first back-end-of-line (BEOL) structure to a second semiconductor substrate 104 in a method of manufacturing an IC device, according to various example embodiments.
Figure 12B:
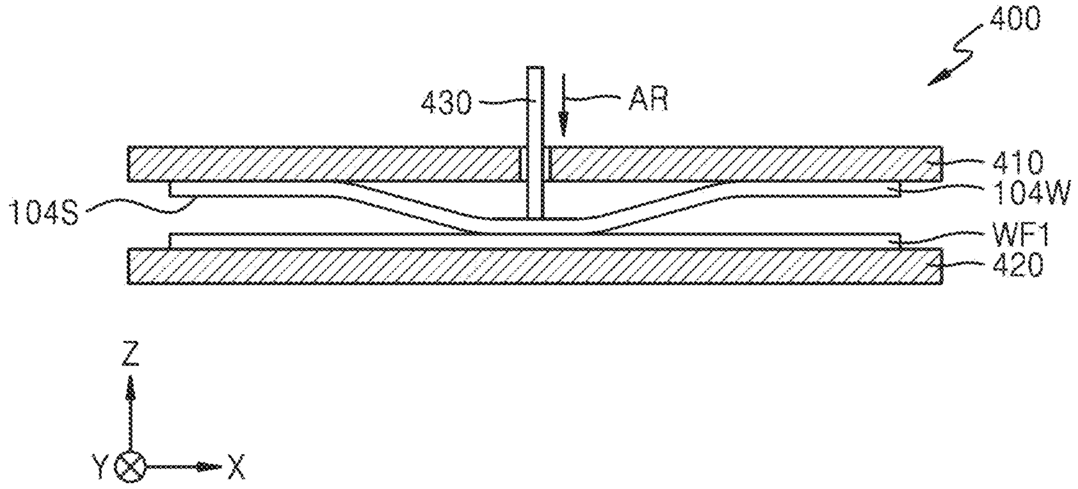

FIGS. 12A and 12B are cross-sectional views showing a process sequence of a method of bonding the first BEOL structure BS1 and the second semiconductor substrate 104, which are cleaned with plasma as described above, according to process P308 of FIG. 10, according to an embodiment.

Referring to FIG. 12A, inside a bonding chamber maintained in a vacuum state, a second wafer 104W may remain adsorbed on a bottom surface of an upper chuck 410 included in a bonding device 400, and a first wafer structure WF1 may remain adsorbed on a top surface of a lower chuck 420 included in the bonding device 400. The second semiconductor substrate 104 shown in FIG. 11C may be at least a portion of the second wafer 104W shown in FIG. 12A.

Referring to FIG. 12B, in the resultant structure of FIG. 12A, a center portion of the second wafer 104W may be pushed down by using a push pin 430 included in the bonding device 400 in the direction of an arrow AR and brought into contact with a center portion of the first wafer structure WF1. As a result, the center portion of the second wafer 104W may be bonded to the center portion of the first wafer structure WF1 due to intermolecular force between mutually contacting surfaces of the center portion of the second wafer 104W and the center portion of the first wafer structure WF1.

When the bonding of the center portion of the second wafer 104W to a center portion of the first wafer structure WF1 is initiated, a bonding wave between the second wafer 104W and the first wafer structure WF1 may propagate in a radial direction from the center portions of the second wafer 104W and the first wafer structure WF1 to the outside of a portion between bonding target surfaces thereof, and thus, a main surface 104S of the second wafer 104W may be bonded to the first BEOL structure BS1 of the first wafer structure WF1. In this case, —Si—OH groups present on the main surface 104S of the second wafer 104W may be bonded to —Si—OH groups present on a bonding target surface of the first BEOL structure BS1. While van der Waals bonds occur between-OH groups present on the respective bonding target surfaces of the second wafer 104W and the first BEOL structure BS1, moisture ($H_2O$) may be separated between the respective bonding target surfaces of the second wafer 104W and the first BEOL structure BS1. As a result, a plurality of local bonding areas (refer to BA in FIGS. 4A to 4C) included in the main surface 104S of the second wafer 104W may be completely bonded to the first BEOL structure BS1 due to Si—O—Si bonds. After the bonding process is completed, an annealing process may be performed in a relatively high temperature atmosphere. In this case, the moisture ($H_2O$) separated between the respective bonding target surfaces of the second wafer 104W and the first BEOL structure BS1 may be removed.

In the same manner as described with reference to FIGS. 12A and 12B, the process of bonding the main surface 104S of the second semiconductor substrate 104 to the first BEOL structure BS1 may be performed by pushing down the center portion of the second wafer 104W using the push pin 430. As a comparative example, when a comparative second wafer having a planar main surface without trenches is used instead of the second wafer 104W having the main surface 104S in which a plurality of trenches are formed in in the method of manufacturing an IC device, according to the inventive concept, while a bonding region between the comparative second wafer and a first wafer structure WF1 is propagating from a center portion of the comparative second wafer to an outer circumferential portion thereof by pushing the center portion of the comparative second wafer by using the push pin 430, a bonding process may be unstable or speed at which a bonding wave propagates outward from the center portion of the comparative second wafer may vary according to a position. Thus, the comparative second wafer may be nonuniformly bonded to the first wafer structure WF1 according to a position. In some cases, the comparative second wafer may be deformed. In particular, when there is anisotropy in Young's modulus of the comparative second wafer, a degree of deformation of the comparative second wafer may be different in a direction in which Young's modulus is high and a direction in which Young's modulus is low. When the comparative second wafer is nonuniformly bonded to the first wafer structure WF1 as described above, the comparative second wafer may be locally distorted after the bonding process. When subsequent processes of manufacturing the IC device 100 are performed while the comparative second wafer is being nonuniformly bonded to the first wafer structure WF1, overlay deterioration between patterns included in the first wafer structure WF1 and patterns included in a second BEOL structure BS2 formed after the bonding process may occur.

In the method of manufacturing the IC device, according to the inventive concept, the main surface 104S of the second semiconductor substrate 104 bonded to the first BEOL structure BS1 may include a plurality of first local trench regions LT1 in which a plurality of first trenches T1 are formed in a regular pattern and a plurality of second local trench regions LT2 in which a plurality of second trenches T2 are formed. Accordingly, when the main surface 104S of the second semiconductor substrate 104 is bonded to the first BEOL structure BS1 according to process P308 of FIG. 10, after the bonding of the center portion of the second wafer 104W to the center portion of the first wafer structure WF1 is initiated, a bonding wave between the second wafer 104W and the first wafer structure WF1 may propagate outward at uniform speed in a radial direction from the center portions of the second wafer 104W and the first wafer structure WF1 to the outside of a portion between bonding target surfaces thereof. Therefore, the bonding process may be stably performed, and thus, a bonding state between the main surface 104S of the second semiconductor substrate 104 and the first BEOL structure BS1 may be uniform according to a position.

Figure 11D:
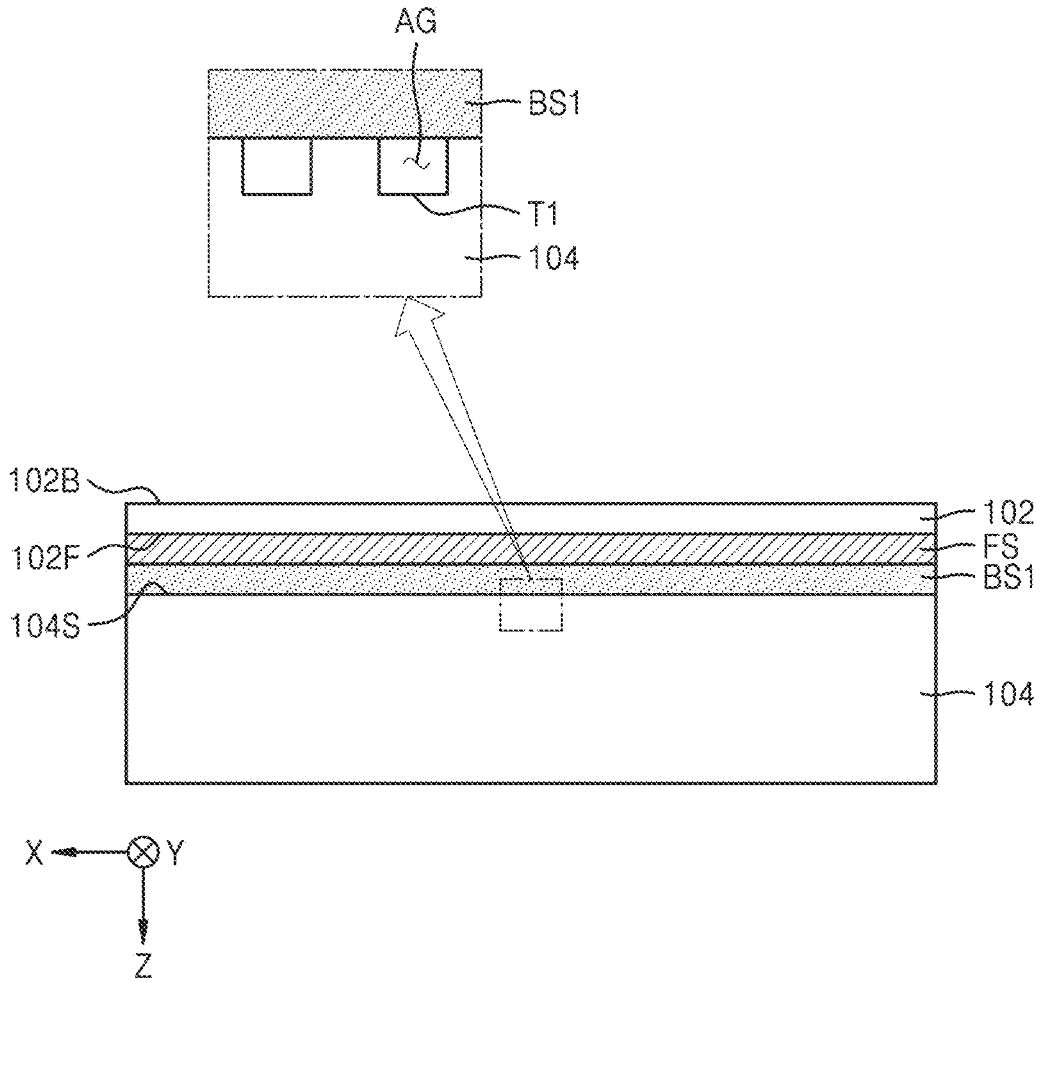
Figure 11E:
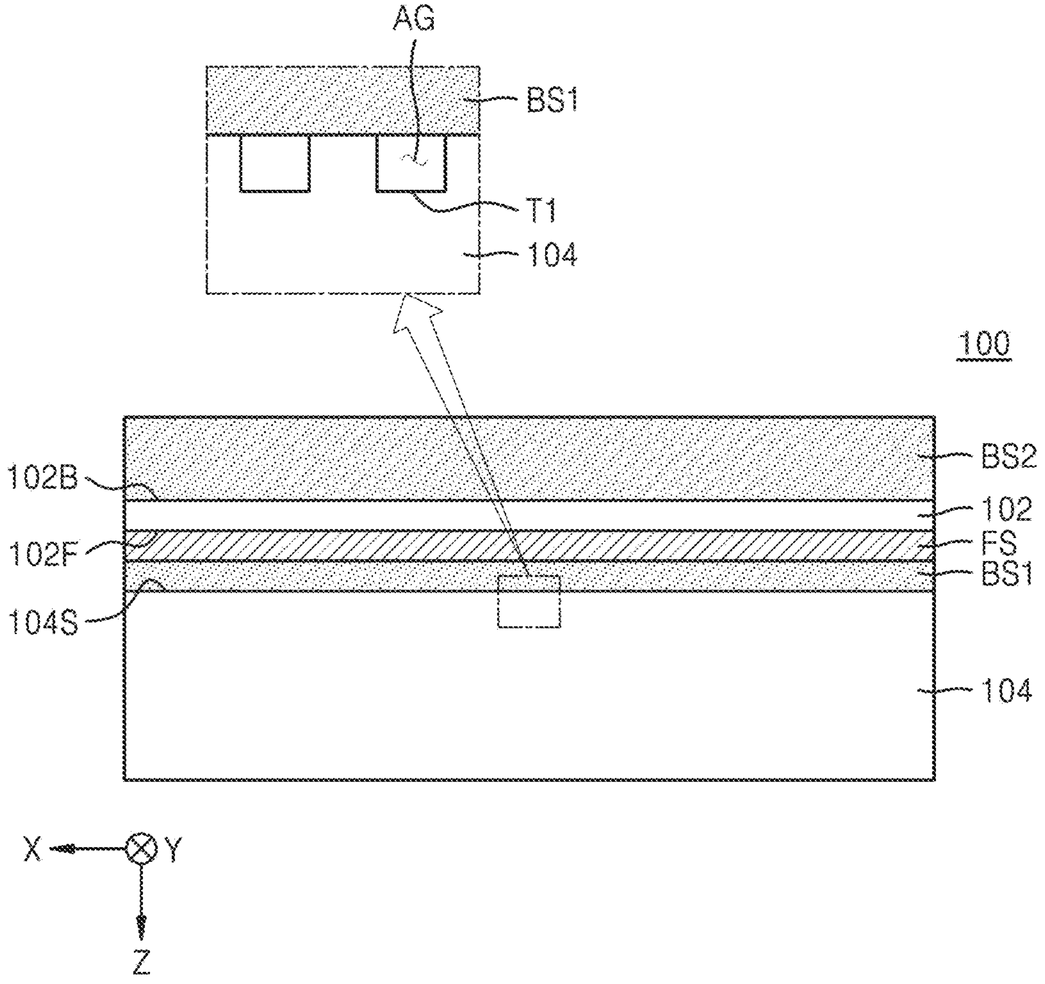

Referring to FIGS. 10 and 11D, in process P310, in the resultant structure of FIG. 11E in which the first BEOL structure BS1 is bonded to the second semiconductor substrate 104, a first semiconductor substrate 102 may be polished from a backside surface 102B of the first semiconductor substrate 102 to reduce a thickness of the first semiconductor substrate 102. As a result, the backside surface 102B of the first semiconductor substrate 102 may become relatively close to a frontside surface 102F of the first semiconductor substrate 102.

In various example embodiments, the first semiconductor substrate 102 may be polished from the backside surface 102B by using at least one selected from a mechanical grinding process, a chemical mechanical polishing (CMP) process, a wet etching process, and a combination thereof.

Referring to FIGS. 10 and 11E, in process P312, in the resultant structure of FIG. 11D, the second BEOL structure BS2 may be formed on the polished backside surface 102B of the first semiconductor substrate 102.

In various example embodiments, the second BEOL structure BS2 may be formed to include the backside wiring structure BWS described with reference to FIGS. 8A to 8D and 9A to 9C.

In various example embodiments, after the first semiconductor substrate 102 is polished according to process P310 of FIG. 10 and before the second BEOL structure BS2 is formed according to process P312 of FIG. 12, a process of forming a contact structure including a plug portion may be further performed. The plug portion may pass through the first semiconductor substrate 102 in a vertical direction (Z direction) from the polished backside surface of the first semiconductor substrate 102. For example, the process of forming the contact structure may further include forming the contact structure including the via power rail VPR and the power rail wiring MPR, which is described with reference to FIGS. 8A to 8D, the contact structure including the backside source/drain contact DBC and the power rail wiring MPR4, which is described with reference to FIGS. 9A to 9C, or variously changed and modified contact structures thereof.

In the method of manufacturing the IC device, according to inventive concepts, even when the first semiconductor substrate 102 gradually becomes thinner and sizes of patterns to be formed on the first semiconductor substrate 102 are reduced, process failures caused by bending distortion of the first semiconductor substrate 102, overlay errors between patterns formed at difference levels on the first semiconductor substrate 102, or overlay errors between patterns included in an FEOL structure FS and patterns included in the second BEOL structure BS2 may be minimized during the manufacture of the IC devices 100, 100A, 100B, 200A, and 200B, and thus, overlay precision may improve. Therefore, in the method of manufacturing the IC device, according to the inventive concept, a reliable IC device may be provided by improving the CD uniformity of patterns required for the manufacture of the IC device, and/or IC device manufacturing productivity may improve.

Figure 13A:
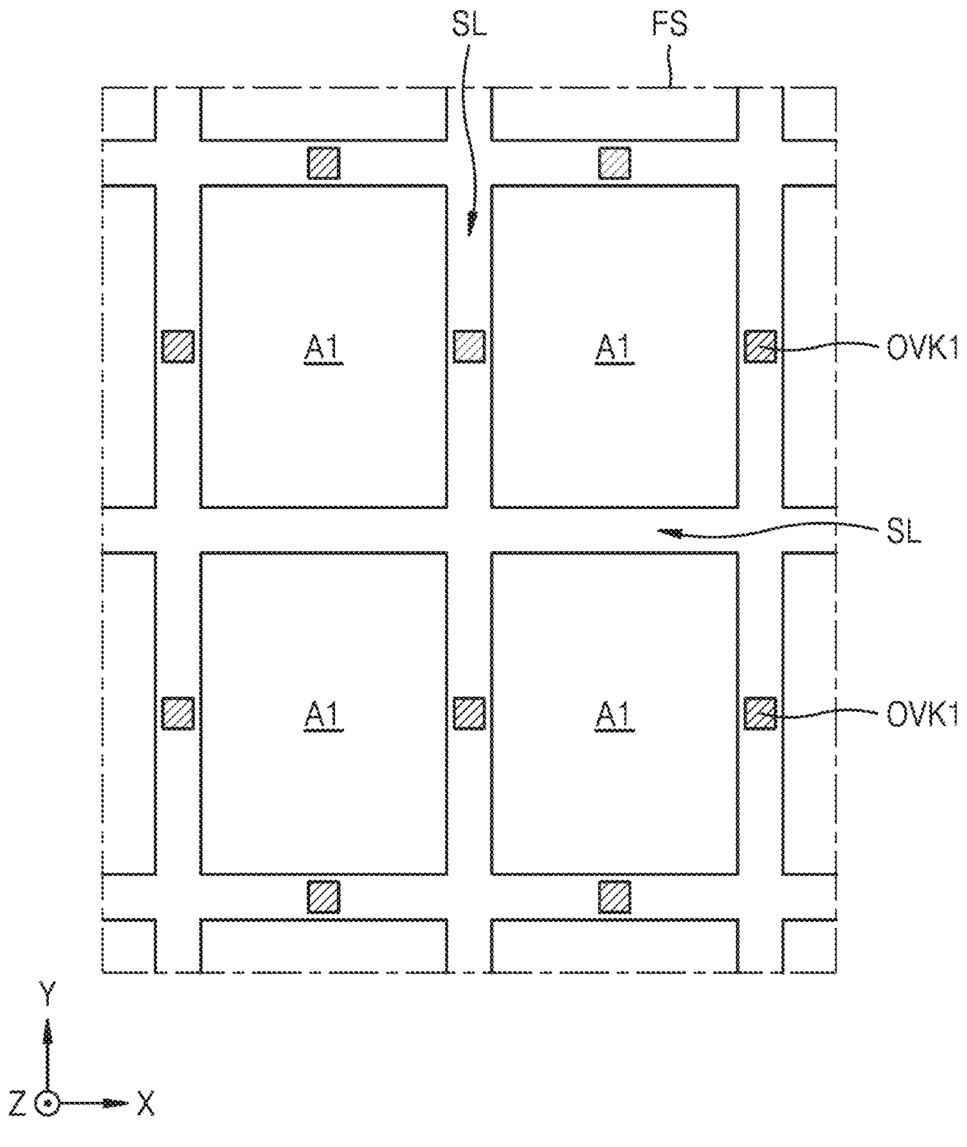
Figure 13B:
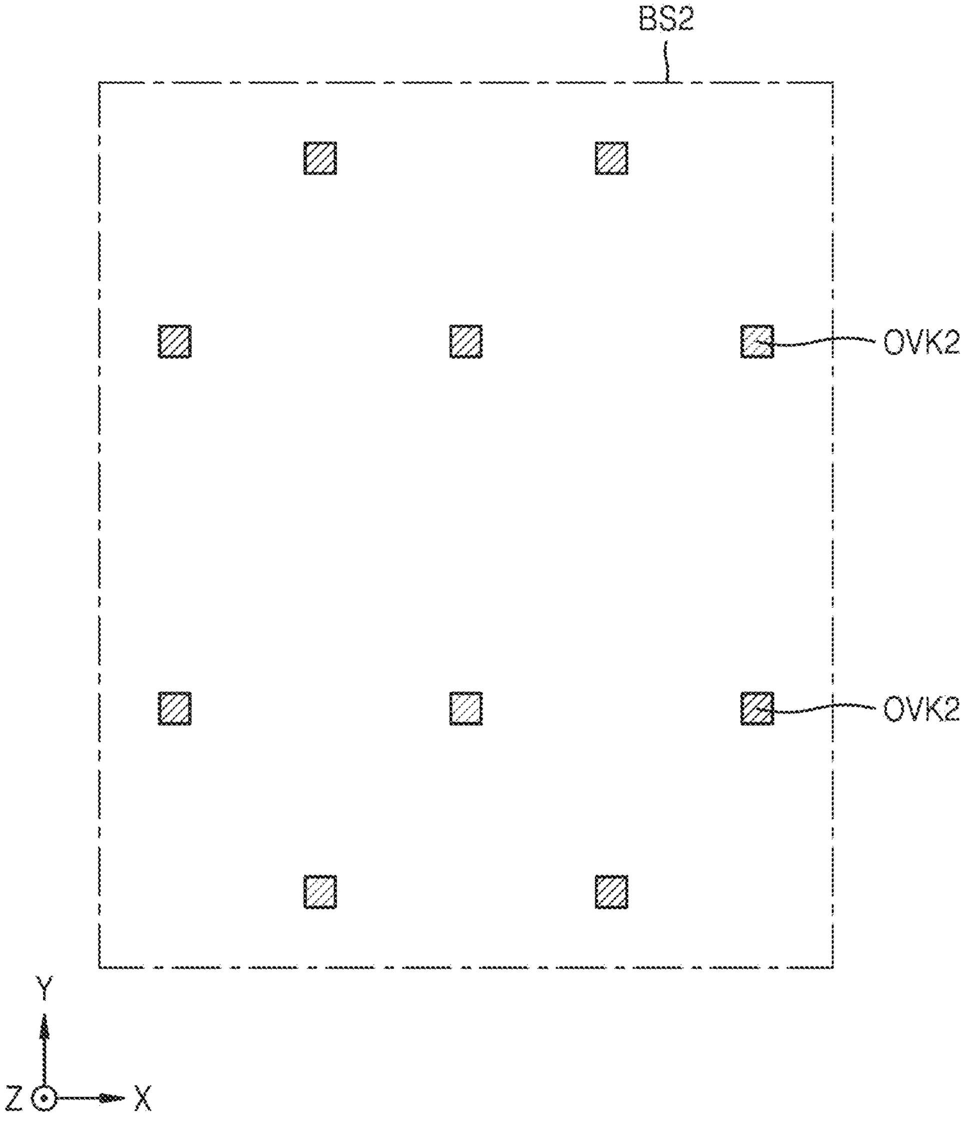
Figure 13C:
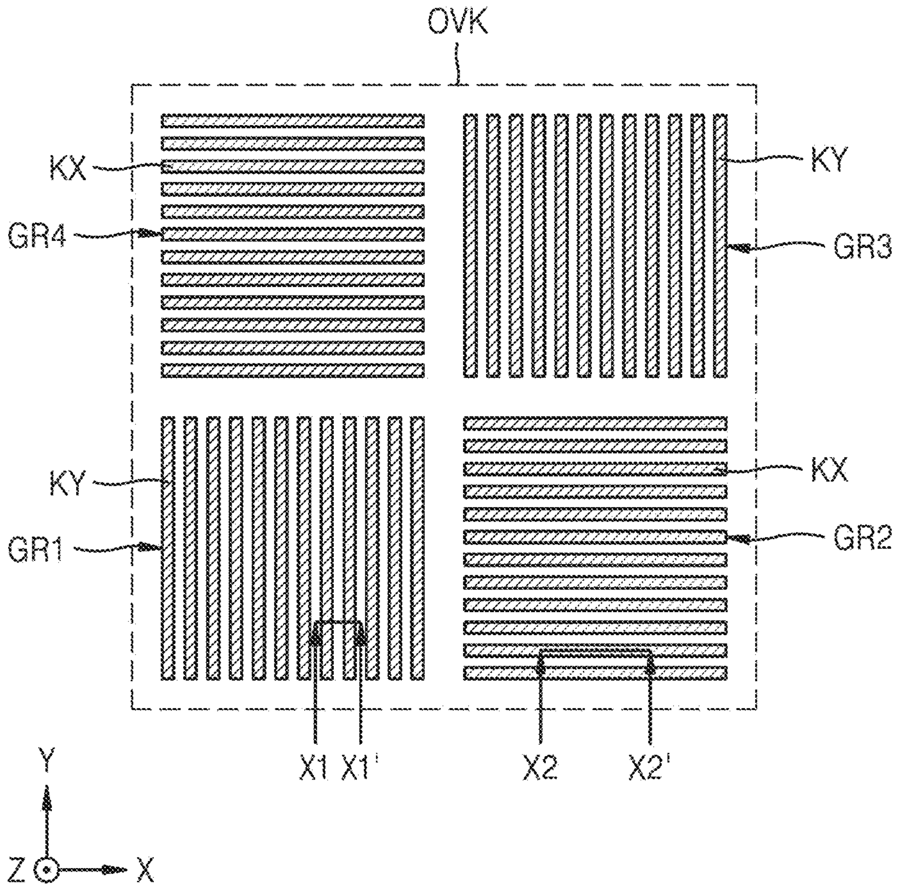
Figure 13D:
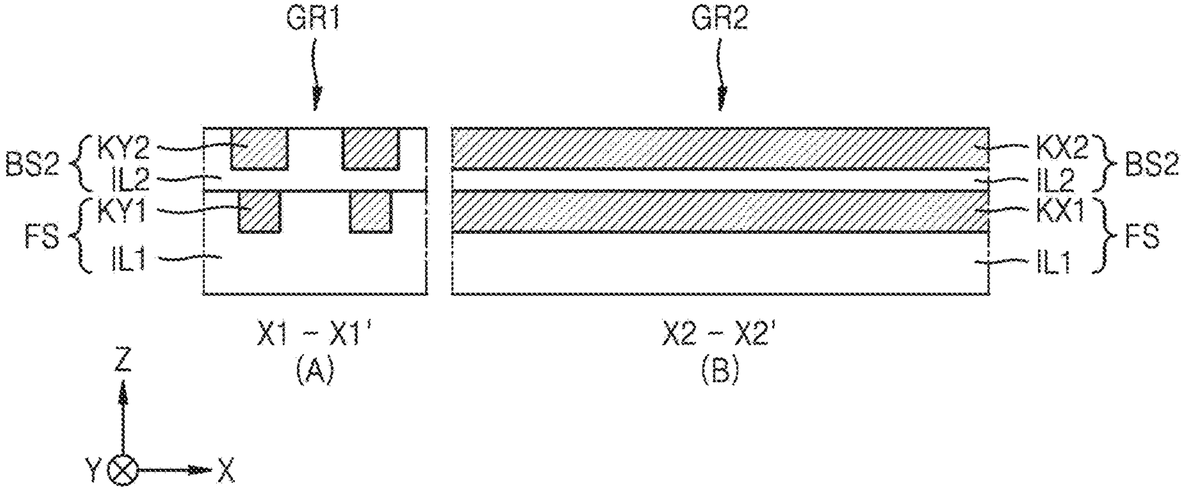

FIGS. 13A, 13B, 13C, and 13D are diagrams for explaining an overlay key that may be used to measure overlay between patterns included in an FEOL structure FS and patterns included in a second BEOL structure BS2 in the method of manufacturing the IC device, which has been described with reference to FIGS. 10 to 12B. More specifically, FIG. 13A is a plan view of a partial region of the FEOL structure FS formed in process P302 of FIG. 10. FIG. 13B is a plan view of a partial region of the second BEOL structure BS2 formed in process P312 of FIG. 10. FIG. 13C is a plan view of an overlay key OVK obtained from the resultant structure in which at least a portion of the second BEOL structure BS2 is formed in process P312 of FIG. 10. FIG. 13D is a cross-sectional view taken along lines X1-X1' and X2-X2' of FIG. 13C.

As shown in FIG. 13A, the FEOL structure FS may include a plurality of chip areas A1. A scribe lane region SL may be between two adjacent ones of the plurality of chip areas A1. The plurality of chip areas A1 may include a plurality of circuit areas. The plurality of circuit areas may include a logic circuit area, a memory area, and an input/output circuit area, without being limited thereto. A plurality first overlay patterns OVK1 may be in the scribe lane region SL of the FEOL structure FS. As shown in FIG. 13B, a plurality of second overlay patterns OVK2 may be in a partial region of the second BEOL structure BS2. Respective positions of the plurality of second overlay patterns OVK2 included in the second BEOL structure BS2 may correspond to respective positions of the plurality of first overlay patterns OVK1 included in the FEOL structure FS. Respective positions and numbers of the plurality of second overlay patterns OVK2 included in the second BEOL structure BS2 and the plurality of first overlay patterns OVK1 included in the FEOL structure FS are not limited to those shown in FIGS. 13A and 13B and may be variously modified and changed as needed.

As shown in FIG. 13C, after at least a portion of the second BEOL structure BS2 is formed according to process P312 of FIG. 10, the overlay key OVK may be obtained. The overlay key OVK may include a combination of the first overlay pattern OVK1 included in the FEOL structure FS and the second overlay pattern OVK2 included in the second BEOL structure BS2.

Referring to FIGS. 13C and 13D, the overlay key OVK may include first to fourth overlay groups GR1, GR2, GR3, and GR4, which are adjacent to each other and apart from each other. The first to fourth overlay groups GR1, GR2, GR3, and GR4 may include a plurality of overlay patterns KX and KY, each of which includes a conductive material. The plurality of overlay patterns KX and KY may be apart from each other with an insulating layer therebetween. The first and third overlay groups GR1 and GR3 may include a plurality of overlay patterns KX that extend long in an X direction in FIG. 13C, and the second and fourth overlay groups GR2 and GR4 may include a plurality of overlay patterns KY that extend long in a Y direction in FIG. 13C.

As illustrated in (A) of FIG. 13D, the first overlay group GR1 of the overlay key OVK may include a first insulating film IL1 included in the FEOL structure FS, an overlay sub-pattern KY1 surrounded by the first insulating film IL1, a second insulating film IL2 included in the second BEOL structure BS2, and an overlay sub-pattern KY2 surrounded by the second insulating film IL2. In the first overlay group GR1, the overlay sub-pattern KY1 included in the FEOL structure FS and the overlay sub-pattern KY2 included in the second BEOL structure BS2 may constitute the overlay pattern KY of the overlay key OVK shown in FIG. 13C. The third overlay group GR3 of the overlay key OVK shown in FIG. 13C may substantially have the same configuration as the first overlay group GR1 described above.

As illustrated in (B) of FIG. 13D, the second overlay group GR2 of the overlay key OVK may include a first insulating film IL1 included in the FEOL structure, an overlay sub-pattern KX1 surrounded by the first insulating film IL1, a second insulating film IL2 included in the second BEOL structure BS2, and an overlay sub-pattern KX2 surrounded by the second insulating film IL2. In the second overlay group GR2, the overlay sub-pattern KX1 included in the FEOL structure FS and the overlay sub-pattern KX2 included in the second BEOL structure BS2 may constitute the overlay pattern KY of the overlay key OVK shown in FIG. 13C. The fourth overlay group GR4 of the overlay key OVK shown in FIG. 13C may substantially have the same configuration as the second overlay group GR2.

Overlay between the patterns included in the FEOL structure FS and the patterns included in the second BEOL structure BS2 may be measured by using the overlay key OVK shown in FIG. 3.

Figure 14A:
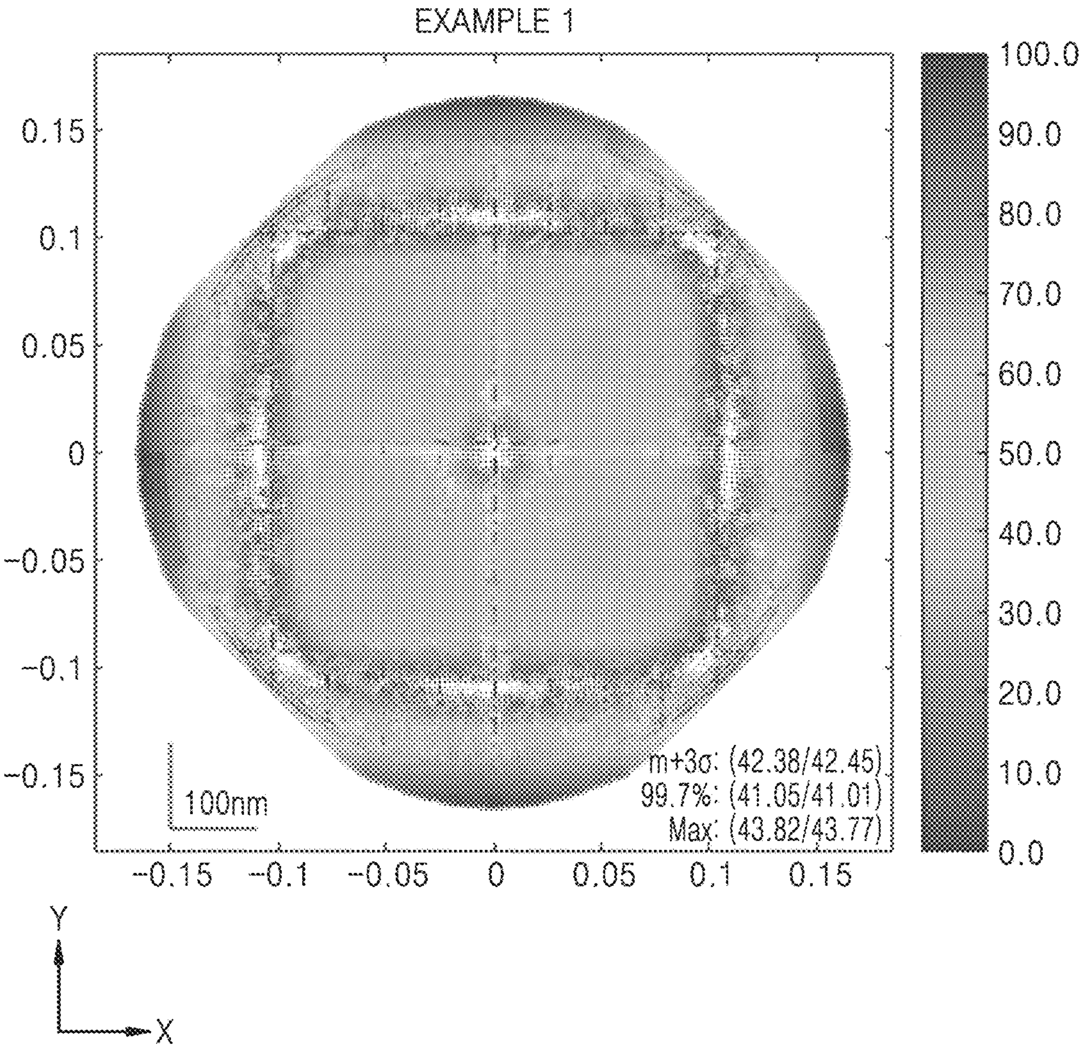
FIGS. 14A and 14B each illustrate an overlay simulation map showing measurement results of overlay between patterns included in an FEOL structure and patterns included in a second BEOL structure in an IC device according to various example embodiments.
Figure 14B:
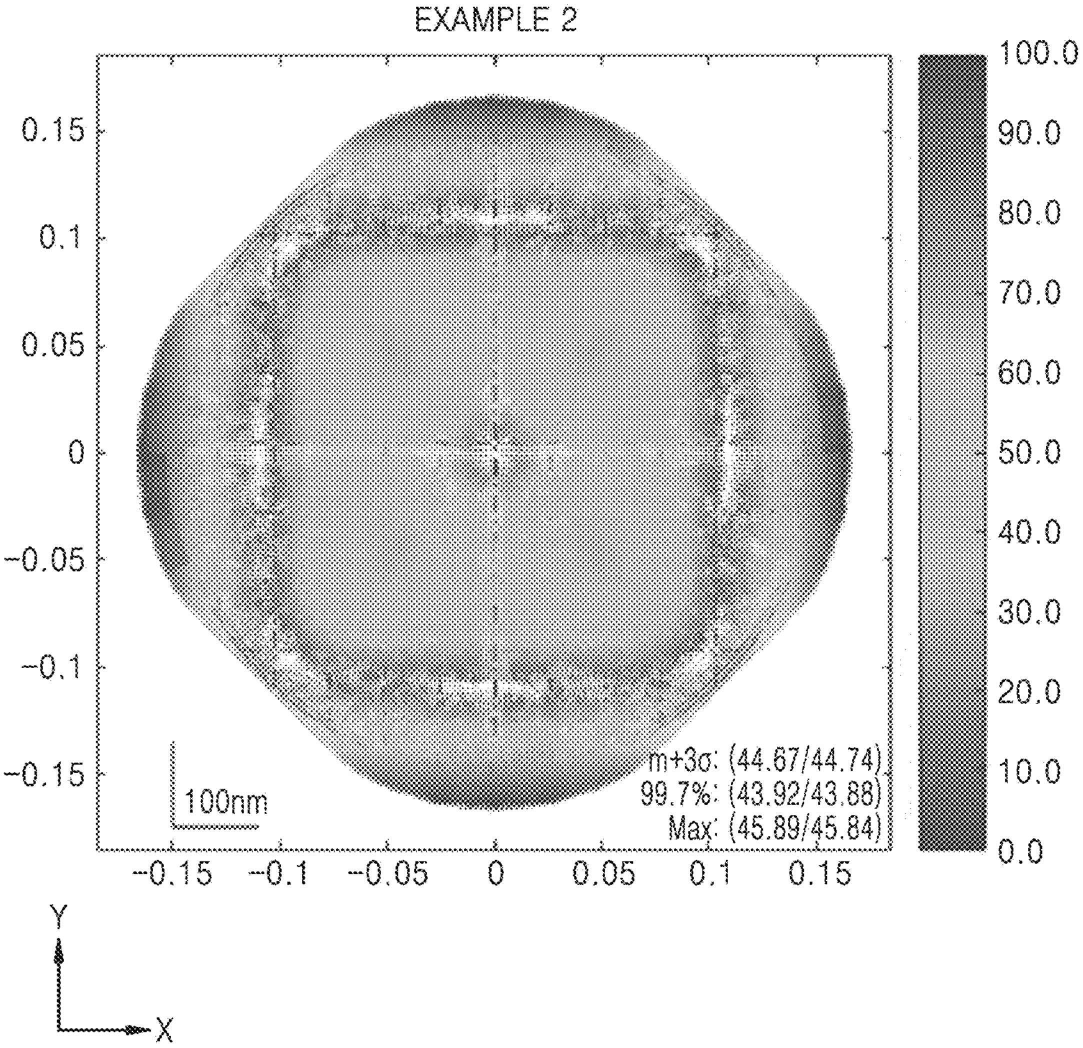

FIGS. 14A and 14B each illustrate an overlay simulation map showing measurement results of overlay between patterns included in an FEOL structure FS and patterns included in a second BEOL structure BS2 in an IC device according to various example embodiments.

More specifically, FIG. 14A illustrates an overlay simulation map showing measurement results of overlay between patterns included in an FEOL structure FS and patterns included in a second BEOL structure BS2 in an IC device (hereinafter, "EXAMPLE 1") that was manufactured by using the second wafer 104W described with reference to FIGS. 3B and 4A to 4C according to the processes described with reference to FIGS. 10 to 11E. FIG. 14B illustrates an overlay simulation map showing measurement results of overlay between patterns included in an FEOL structure FS and patterns included in a second BEOL structure BS2 in an IC device (hereinafter, "EXAMPLE 2") that was manufactured by using processes similar to the processes described with reference to FIGS. 10 to 11E except that the second wafer 204W described with reference to FIGS. 7B and 7C is used instead of the second wafer 104W.

In the second wafer 104W used in EXAMPLE 1, each of a plurality of first trenches T1 and a plurality of second trenches T2 had a width of 300 nm, a pitch of the plurality of first trenches T1 arranged in each of a plurality of first local trench regions LT1 was 600 nm, and a pitch of the plurality of second trenches T2 arranged in each of a plurality of second local trench regions LT2 was 600 nm. That is, each of the plurality of first trenches T1 and the plurality of second trenches T2 had a width of 300 nm, and each of local bonding areas BA2 between the plurality of first trenches T1 and the plurality of second trenches T2 had a width of 300 nm. A depth (i.e., a size in a vertical direction (Z direction) of FIGS. 4A and 7A) of each of the plurality of first trenches T1 and the plurality of second trenches T2 was 100 nm. Each of the plurality of first trenches T21B and the plurality of second trenches T22B in the second wafer 204W included in EXAMPLE 2 was formed to have the same width, pitch, and depth as each of the plurality of first trenches T1 and the plurality of second trenches T2 in the second wafer 104W included in EXAMPLE 1.

Figure 14C:
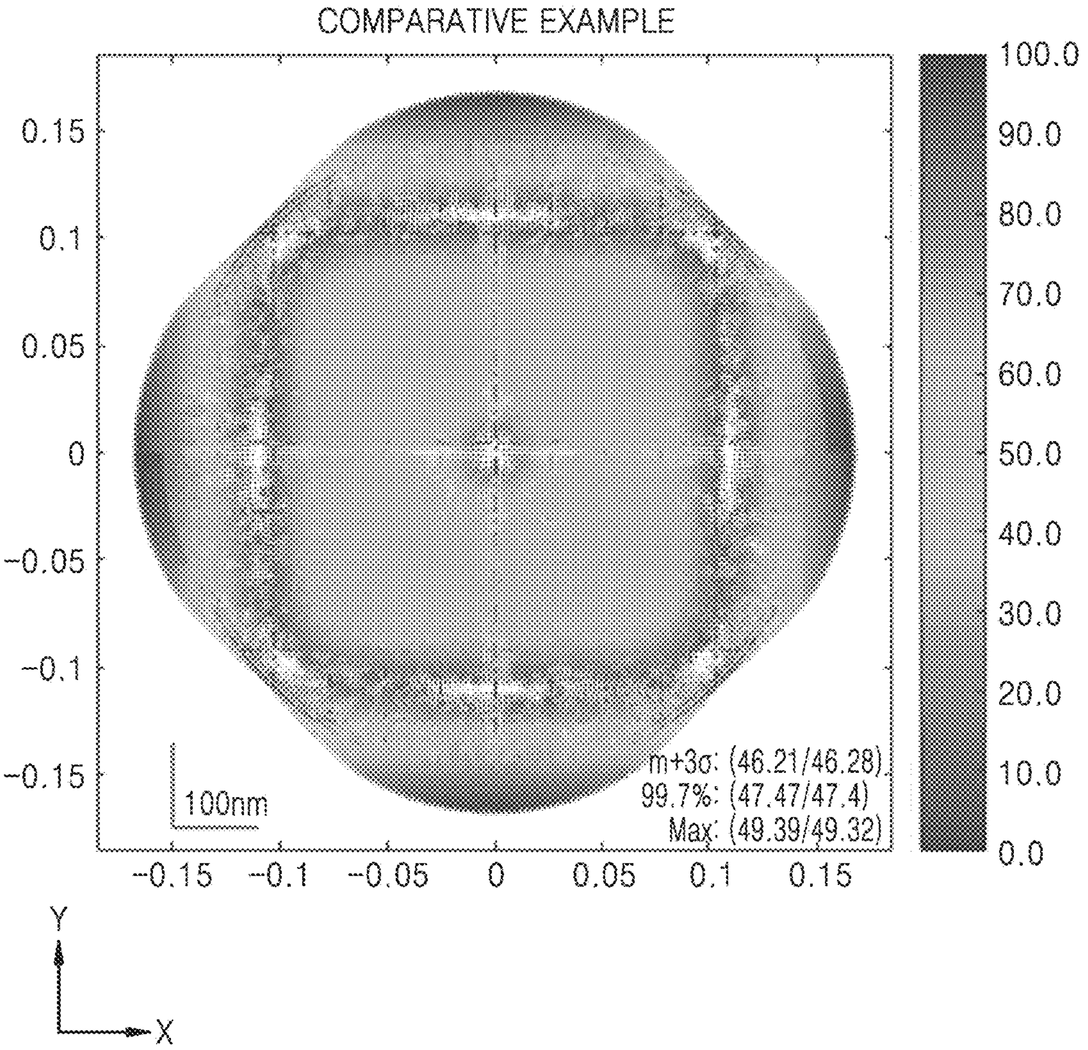
FIG. 14C illustrates an overlay simulation map showing measurement results of overlay between patterns included in patterns included in an FEOL structure and patterns included in a second BEOL structure in an IC device according to Comparative example.

FIG. 14C illustrates an overlay simulation map showing measurement results of overlay between patterns included in patterns included in an FEOL structure FS and patterns included in a second BEOL structure BS2 in an IC device according to Comparative example. FIG. 14C illustrates an overlay simulation map showing measurement results of overlay between patterns included in an FEOL structure FS and patterns included in a second BEOL structure BS2 an IC device (hereinafter, "COMPARATIVE EXAMPLE") that was manufacturing by using processes similar to those described with reference to FIGS. 10 to 11E except that a bare wafer having a planar main surface without trenches was used instead of the second wafer 104W.

In the evaluation results of EXAMPLE 1 shown in FIG. 14A, the sum (M+3σ) of an average value M of an overlay offset measured in an X direction of FIG. 14A and a standard deviation 36 was about 42.4, and the sum (M+3σ) of an average value M of an overlay offset measured in a Y direction of FIG. 14A and a standard deviation 36 was about 42.5.

In the evaluation results of EXAMPLE 2 shown in FIG. 14B, the sum (M+3σ) of an average value M of an overlay offset measured in an X direction of FIG. 14B and a standard deviation 36 was about 44.7, and the sum (M+3σ) of an average value M of an overlay offset measured in a Y direction of FIG. 14B and a standard deviation 36 was about 44.7.

In the evaluation results of COMPARATIVE EXAMPLE shown in FIG. 14C, the sum (M+3σ) of an average value M of an overlay offset measured in an X direction of FIG. 14C and a standard deviation 36 was about 46.2, and the sum (M+3σ) of an average value M of an overlay offset measured in a Y direction of FIG. 14C and a standard deviation 30 was about 46.3.

From the results of FIGS. 14A to 14C, it can be seen that in EXAMPLE 1 and EXAMPLE 2, overlay between the patterns included in the FEOL structure FS and the patterns included in the second BEOL structure BS2 was improved by about 2 nm to about 4 nm as compared to COMPARATIVE EXAMPLE.

When the terms "about" or "substantially" are used in this specification in connection with a numerical value, it is intended that the associated numerical value includes a manufacturing or operational tolerance (e.g., +10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While the inventive concept has been particularly shown and described with reference to various example embodiments thereof, it will be understood that various changes in form and details may be made therein without departing from the spirit and scope of the following claims. Additionally, example embodiments are not necessarily mutually exclusive with one another. For example, some example embodiments may include one or more features described with reference to one or more figures, and may also include one or more other features described with reference to one or more other figures.

What is claimed is:

1. An integrated circuit device comprising:

a first semiconductor substrate having a frontside surface and a backside surface that are opposite to each other;

a front-end-of-line (FEOL) structure on the frontside surface of the first semiconductor substrate, the FEOL structure comprising a plurality of fin-type active areas;

a first back-end-of-line (BEOL) structure on the FEOL structure, the first BEOL structure apart from the first semiconductor substrate in a vertical direction with the FEOL structure therebetween;

a second BEOL structure on the backside surface of the first semiconductor substrate, the second BEOL structure apart from the FEOL structure in the vertical direction with the first semiconductor substrate therebetween; and a second semiconductor substrate apart from the first semiconductor substrate in the vertical direction with the FEOL structure and the first BEOL structure therebetween, the second semiconductor substrate locally bonded to the first BEOL structure, wherein the second semiconductor substrate comprises a main surface facing the first BEOL structure, and the main surface of the second semiconductor substrate defines a plurality of local trench regions in which a plurality of trenches are arranged in a regular pattern and a plurality of local bonding areas bonded to the first BEOL structure.

2. The integrated circuit device of claim 1, wherein, in the main surface of the second semiconductor substrate, the plurality of local trench regions comprise a plurality of first local trench regions and a plurality of second local trench regions, the plurality of first local trench regions comprising a plurality of first trenches extending lengthwise in a first direction, the plurality of second local trench regions comprising a plurality of second trenches extending lengthwise in a second direction, wherein the second direction intersects the first direction, and the plurality of local trench regions have a mesh shape in which the plurality of first local trench regions and the plurality of second local trench regions intersect each other.

3. The integrated circuit device of claim 2, wherein the main surface of the second semiconductor substrate has at least one shot area comprising a tetragonal region, and in the main surface of the second semiconductor substrate, each of the plurality of first local trench regions and the plurality of second local trench regions extends along in a direction parallel to at least one side of the at least one shot area.

4. The integrated circuit device of claim 2, wherein the main surface of the second semiconductor substrate has at least one shot area comprising a tetragonal region, and in the main surface of the second semiconductor substrate, each of the plurality of first local trench regions and the plurality of second local trench regions extends along in a direction parallel to one diagonal direction of the at least one shot area.

5. The integrated circuit device of claim 1, wherein the integrated circuit device defines a plurality of air gaps defined by the plurality of trenches of the second semiconductor substrate and the first BEOL structure.

6. The integrated circuit device of claim 5, wherein a length of each of the plurality of air gaps in the vertical direction is in a range of 100 nm to 150 nm, a width of each of the plurality of air gaps is in a range of 300 nm to 500 nm, and a pitch of each of the plurality of air gaps is in a range of 600 nm to 1 μm.

7. The integrated circuit device of claim 1, wherein the second semiconductor substrate has at least one shot area, and an area occupied by the plurality of trenches in the at least one shot area is 20% or less.

8. The integrated circuit device of claim 1, wherein a width of each of the plurality of trenches in the second semiconductor substrate is in a range of 300 nm to 500 nm, and a pitch of the plurality of trenches in the plurality of local trench regions of the second semiconductor substrate is in a range of 600 nm to 1 μm.

9. The integrated circuit device of claim 1, wherein the FEOL structure is included in a logic cell.

10. The integrated circuit device of claim 1, further comprising:

a power rail wiring passing through the first semiconductor substrate in the vertical direction, wherein the second BEOL structure comprises a wiring layer on a backside surface of the first semiconductor substrate, the wiring layer connected to the power rail wiring.

11. The integrated circuit device of claim 1, further comprising:

a contact structure passing through the first semiconductor substrate in the vertical direction, wherein the FEOL structure further comprises:

a source/drain region on a first fin-type active area from among the plurality of fin- type active areas, the source/drain region apart from the first semiconductor substrate in the vertical direction with the first fin-type active area therebetween; and a source/drain contact apart from the first semiconductor substrate in the vertical direction with the first fin-type active area and the source/drain region therebetween, the source/drain contact connected to the source/drain region, wherein the contact structure is connected to one of the source/drain region and the source/drain contact.

12. The integrated circuit device of claim 1, wherein the FEOL structure further comprises:

a gate line on a first fin-type active area from among the plurality of fin-type active areas;

at least one nanosheet between the first fin-type active area and the gate line, the at least one nanosheet surrounded by the gate line;

a source/drain region on the first fin-type active area, the source/drain region contacting the at least one nanosheet;

a source/drain contact between the source/drain region and the first BEOL structure, the source/drain contact connected to the source/drain region;

an insulating structure comprising a device isolation film covering first and second sidewalls of the first fin-type active area; and a contact structure passing through the first semiconductor substrate and the insulating structure in the vertical direction, the contact structure connected to at least one of the source/drain region and the source/drain contact.

13. An integrated circuit device comprising:

a first semiconductor substrate having a frontside surface and a backside surface, which are opposite to each other;

a front-end-of-line (FEOL) structure on the frontside surface of the first semiconductor substrate, the FEOL structure comprising a plurality of fin-type active areas;

a first back-end-of-line (BEOL) structure on the FEOL structure, the first BEOL structure apart from the first semiconductor substrate in a vertical direction with the FEOL structure therebetween;

a second BEOL structure on the backside surface of the first semiconductor substrate, the second BEOL structure apart from the FEOL structure in the vertical direction with the first semiconductor substrate therebetween; and a second semiconductor substrate apart from the first semiconductor substrate in the vertical direction with the FEOL structure and the first BEOL structure therebetween, the second semiconductor substrate having a main surface locally bonded to the first BEOL structure, wherein the main surface of the second semiconductor substrate defines a plurality of air gaps together with the first BEOL structure and defines a plurality of local trench regions in which a plurality of trenches are arranged in a regular pattern and a plurality of local bonding areas are bonded to the first BEOL structure.

14. The integrated circuit device of claim 13, wherein the main surface of the second semiconductor substrate has at least one shot area comprising a tetragonal region, and the plurality of local trench regions comprise a plurality of first local trench regions and a plurality of second local trench regions, the plurality of first local trench regions comprising a plurality of first trenches extending lengthwise in a direction parallel to a first side of the at least one shot area in a first direction, the plurality of second local trench regions comprising a plurality of second trenches extending lengthwise in a direction parallel to a second side of the at least one area in a second direction, wherein the second direction intersects the first direction of the at least one shot area.

15. The integrated circuit device of claim 13, wherein the main surface of the second semiconductor substrate has at least one shot area comprising a tetragonal region, and the plurality of local trench regions comprise a plurality of first local trench regions and a plurality of second local trench regions, the plurality of first local trench regions comprising a plurality of first trenches extending lengthwise in a direction parallel to a first diagonal line of the at least one shot area, the plurality of second local trench regions comprising a plurality of second trenches extending lengthwise in a direction parallel to a second diagonal line intersecting the first diagonal line of the at least one shot area.

16. The integrated circuit device of claim 13, wherein a length of each of the plurality of air gaps in the vertical direction is in a range of 100 nm to 150 nm, a width of each of the plurality of air gaps is in a range of 300 nm to 500 nm, and a pitch of each of the plurality of air gaps is in a range of 600 nm to 1 μm.

17. The integrated circuit device of claim 13, wherein the second semiconductor substrate has at least one shot area, and an area occupied by the plurality of trenches in an area of the at least one shot area is 20% or less.

18. An integrated circuit device comprising:

a first semiconductor substrate having a frontside surface and a backside surface that are opposite to each other;

a front-end-of-line (FEOL) structure comprising a fin-type active area integrally connected to the first semiconductor substrate, a gate line on the fin-type active area, and at least one nanosheet between the fin-type active area and the gate line, the at least one nanosheet surrounded by the gate line;

a first back-end-of-line (BEOL) structure on the FEOL structure, the first BEOL structure apart from the first semiconductor substrate in a vertical direction with the FEOL structure therebetween, and the first BEOL structure comprising a frontside wiring structure;

a second BEOL structure on the backside surface of the first semiconductor substrate, the second BEOL structure apart from the FEOL structure in the vertical direction with the first semiconductor substrate therebetween, the second BEOL structure comprising a backside wiring structure; and a second semiconductor substrate apart from the first semiconductor substrate in the vertical direction with the FEOL structure and the first BEOL structure therebetween, wherein the second semiconductor substrate faces a main surface facing the first BEOL structure, the main surface defines a first local trench region and a second local trench region, which extend along in directions intersecting each other, and a plurality of local bonding areas bonded to the first BEOL structure, wherein a plurality of trenches are arranged in a regular pattern in each of the first local trench region and the second local trench region, and an area occupied by the plurality of trenches in a unit area of the main surface is 20% or less.

19. The integrated circuit device of claim 18, wherein in the second semiconductor substrate, the unit area of the main surface is an exposure shot area, and in the main surface of the second semiconductor substrate, each of the first local trench region and the second local trench region extends long in a selected one of a first direction and a second direction, wherein the first direction is parallel to at least one side of the exposure shot area, and the second direction is parallel to at least one diagonal direction of exposure the shot area.

20. The integrated circuit device of claim 18, wherein the integrated circuit device defines a plurality of air gaps defined by the plurality of trenches of the second semiconductor substrate and the first BEOL structure, a length of each of the plurality of air gaps in the vertical direction is in a range of 100 nm to 150 nm, width of each of the plurality of air gaps is in a range of 300 nm to 500 nm, and a pitch of each of the plurality of air gaps is in a range of 600 nm to 1 μm.

* * * * *